US009034674B2

(12) United States Patent
Speier et al.

(10) Patent No.: US 9,034,674 B2
(45) Date of Patent: May 19, 2015

(54) METHOD AND APPARATUS FOR COUPLING LIGHT-EMITTING ELEMENTS WITH LIGHT-CONVERTING MATERIAL

(75) Inventors: Ingo Speier, Saanichton (CA); Robert C. Gardner, Atherton, CA (US); Louis Lerman, Las Vegas, NV (US); Chris Lowery, Fall River Mills, CA (US); Allan Brent York, Langley (CA)

(73) Assignee: Quarkstar LLC, Las Vegas, NV (US)

(*) Notice: Subject to any disclaimer, the term of this patent is extended or adjusted under 35 U.S.C. 154(b) by 334 days.

(21) Appl. No.: 13/436,166

(22) Filed: Mar. 30, 2012

(65) Prior Publication Data
US 2013/0037838 A1    Feb. 14, 2013

Related U.S. Application Data

(63) Continuation of application No. 13/205,572, filed on Aug. 8, 2011, now abandoned.

(51) Int. Cl.
*H01L 21/00* (2006.01)
*H01L 51/50* (2006.01)
*H01L 51/00* (2006.01)
*H01L 25/075* (2006.01)
*H01L 33/50* (2010.01)

(52) U.S. Cl.
CPC ......... *H01L 51/5036* (2013.01); *H01L 25/0753* (2013.01); *H01L 51/0013* (2013.01); *H01L 33/50* (2013.01); *H01L 2933/0041* (2013.01)

(58) Field of Classification Search
USPC .......................................... 438/21, 29, 30, 31
See application file for complete search history.

(56) References Cited

U.S. PATENT DOCUMENTS

| 6,099,893 | A  | 8/2000  | Lee et al. |
| 6,855,384 | B1 | 2/2005  | Nirmal et al. |
| 7,229,676 | B2 | 6/2007  | Blanchet-Fincher |
| 7,892,382 | B2 | 2/2011  | Bellmann et al. |
| 2003/0180447 | A1 | 9/2003 | Meth |
| 2004/0004433 | A1 | 1/2004 | Lamansky |
| 2006/0228974 | A1 | 10/2006 | Thelss |

OTHER PUBLICATIONS

Notification of Transmittal of the International Search Report and the Written Opinion of the International Searching Authority, mailed Mar. 7, 2013 in International Application No. PCT/US2012/049630, 12 pages.

*Primary Examiner* — Reema Patel
(74) *Attorney, Agent, or Firm* — Fish & Richardson P.C.

(57) ABSTRACT

Light-emitting elements such as LEDs are associated with light-converting material such as phosphor and/or other material. A donor substrate comprising the light-converting and/or other material is suitably placed relative to a target substrate associated with the light-emitting elements. A laser or other energy source is then used to transfer the light-converting and/or other material in a pattern via writing or masking from the donor substrate to the target substrate in accordance with the pattern. Addressability and targetability of the transfer process facilitates precise patterning of the target substrate.

14 Claims, 14 Drawing Sheets

US 9,034,674 B2

METHOD AND APPARATUS FOR COUPLING LIGHT-EMITTING ELEMENTS WITH LIGHT-CONVERTING MATERIAL

CLAIM OF PRIORITY

This application claims priority under 35 USC §120 to U.S. patent application Ser. No. 13/205,572, filed on Aug. 8, 2011, the entire contents of which are hereby incorporated by reference.

TECHNICAL FIELD

The present technology pertains in general to manufacturing of solid-state lighting devices and in particular to methods and apparatus for coupling solid-state light-emitting elements such as LEDs with light-converting materials such as phosphors.

BACKGROUND

Solid-state lighting devices such as light-emitting diodes (LEDs) can provide for efficient and versatile light sources. Characteristics of the light emitted by such lighting devices, such as chromaticity, can be adjusted by utilizing light-converting materials, such as phosphors. As an example, white light LEDs can be manufactured by applying a yellow emitting phosphor coating to a blue or ultraviolet "pump" LED, respectively. Light from the pump LED is absorbed by the phosphor, causing the phosphor to re-emit light at a different characteristic wavelength. The perceived colour of combined light from the LED and phosphor coating may thus be adjusted to a desired white. A variety of methods for providing light of a desired chromaticity are known.

The reliable manufacture of lighting devices utilizing solid-state light sources in combination with light-converting materials faces several challenges. Firstly, light-emitting elements such as LEDs typically exhibit substantial variation in chromaticity and other characteristics, both within and between manufacturing batches. Secondly, properties of light-converting material as well as the disposed quantities thereof exhibit fluctuations that can be poorly controlled in conventional manufacturing processes. Conventional manufacturing processes usually dispense phosphors suspended in a binder solution of silicone into a cavity engulfing the LED (s), thereby providing limited control over composition and disposition of adequate amounts of phosphors. Such processes consequently provide poor control over conversion efficiency and chromaticity variations of the generated light. Moreover, unused binder solution typically ends up as waste because recycling of phosphors from typical binder solutions is prohibitively expensive. Typically, manufacturing costs are therefore unnecessarily high when phosphors are wasted that include expensive rare earth elements.

As a result, existing methods for producing solid-state lighting devices incorporating light-converting materials can exhibit significant variation. For example, existing bulk manufacturing processes for producing white phosphor coated LEDs typically provide LEDs which may significantly and perceptibly vary with respect to chromaticity, which necessitates testing and binning of the LEDs. Manufacturing yields are thus reduced by variations in the source materials and variations due to the phosphor coating process. Therefore, there is a need for a method and apparatus for coupling solid-state light-emitting elements with light-converting materials that is not subject to one or more of the above limitations.

U.S. Pat. No. 5,521,035 discloses methods for preparing color filter elements using laser induced transfer of colorants with associated liquid crystal display devices. Color filter elements are prepared by the laser-induced transfer of colorant from a color donor to a transparent, non-birefringent substrate such as glass or polymeric film.

U.S. Pat. No. 5,171,650 discloses a method and system for creating and transferring a pattern from a composite ablation-transfer imaging medium to a receptor element in contiguous registration therewith. The method is applicable for color proofing and printing, security coding, graphic arts and printed circuit industries. The composite imaging medium comprises a support substrate, one or more dynamic release layers, and an imaging radiation-ablative carrier topcoat, which includes an imaging amount of a contrast imaging material. The dynamic release layer absorbs radiation to effect the imagewise ablation mass transfer of the carrier topcoat.

U.S. Pat. No. 7,153,618 discloses a method of forming a color filter substrate of a liquid crystal display device. A black matrix is formed on a substrate, a color filter transfer film is attached to the substrate, and a laser beam is used to irradiate the entirety of the color filter transfer film. The color filter transfer film includes red, green and blue color filter patterns. The transfer film is removed from the substrate such that the red, green and blue color filter patterns remain on the substrate.

This background information is provided for the purpose of making known information believed by the applicant to be of possible relevance to the present technology. No admission is necessarily intended, nor should be construed, that any of the preceding information constitutes prior art against the present technology.

SUMMARY OF THE TECHNOLOGY

An object of the present technology is to provide a method and apparatus for coupling light-emitting elements with one or more light-converting materials. Another object of the present technology is to provide corresponding light-emitting elements coupled with light-converting materials. In accordance with an aspect of the present technology, there is provided a method for coupling one or more light-emitting elements with a light-converting material, comprising providing a target substrate, the target substrate associated with the one or more light-emitting elements: providing a donor substrate proximate to the target substrate, the donor substrate comprising the light-converting material and configured to transfer a portion of the light-converting material to the target substrate upon a predetermined energization of a corresponding portion of the donor substrate; and controllably energizing one or more selected locations of the donor substrate, thereby transferring the light-converting material from the donor substrate to the target substrate at said one or more selected locations.

In accordance with another aspect of the present technology, there is provided a lighting device comprising one or more light-emitting elements of a first size; and a pattern of light-converting material, the light-converting material operatively coupled to the light emitting elements, the pattern comprising one or more features having a second size smaller than the first size.

In accordance with another aspect of the present technology, there is provided an apparatus for coupling one or more light-emitting elements with a light-converting material, the apparatus comprising an operating area configured to receive a target substrate, the target substrate associated with the one or more light-emitting elements; the operating area further configured to receive a donor substrate proximate to the target substrate, the donor substrate comprising the light-converting material, the donor substrate configured to transfer a portion of the light-converting material to the target substrate upon a predetermined energization of a corresponding portion of the donor substrate; a laser system configured to energize one or more selected locations of the donor substrate located in the operating area, thereby transferring the light-converting material from the donor substrate to the target substrate at said one or more selected locations; and a motion system configured to align the laser system to aim laser light generated thereby at the one or more selected locations.

BRIEF DESCRIPTION OF THE FIGURES

These and other features of the technology will become more apparent in the following detailed description in which reference is made to the appended drawings.

DETAILED DESCRIPTION OF THE TECHNOLOGY

Definitions

Figure 1:
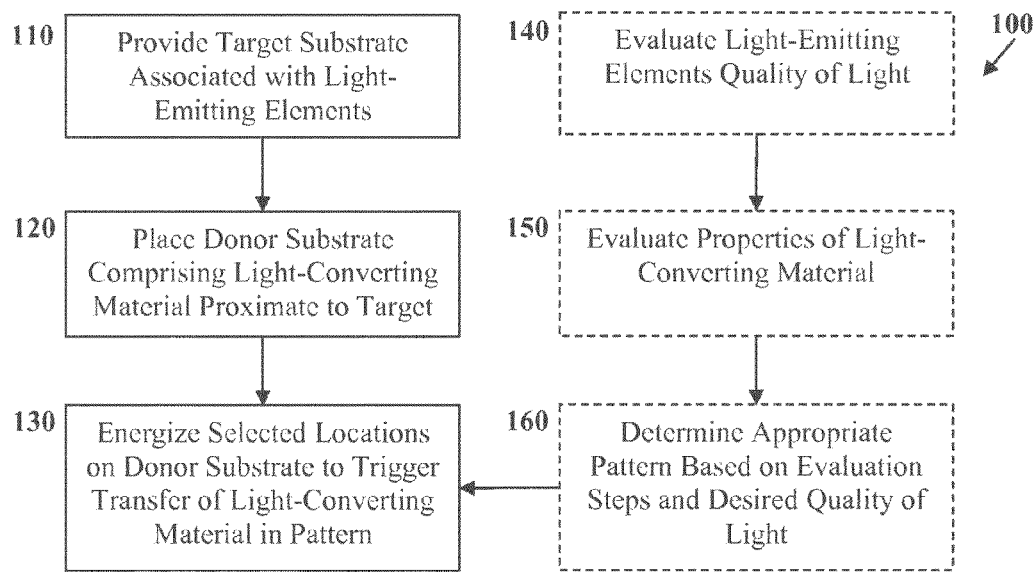
FIG. 1 illustrates a method for coupling one or more light-emitting elements with a light-converting material, in accordance with embodiments of the present technology.

The term "light-converting material" is used to define materials which absorb photons according to a first spectral distribution and emit photons according to a second spectral distribution. Light-converting material may, in some embodiments, be described as "color-converting material." Light-converting materials may comprise photoluminescent substances, fluorescent substances, phosphors, quantum dots, semiconductor-based optical converters, or the like. Light-converting materials may comprise rare-earth elements.

The term "light-emitting element" (LEE) is used to define any device that emits radiation in any region or combination of regions of the electromagnetic spectrum for example, the visible region, infrared and/or ultraviolet region, when activated by applying a potential difference across it or passing a current through it, for example. Therefore a light-emitting element can have monochromatic, quasi-monochromatic, polychromatic or broadband spectral emission characteristics. Examples of light-emitting elements include semiconductor, organic, or polymer/polymeric light-emitting diodes, optically pumped phosphor coated light-emitting diodes, optically pumped nano-crystal light-emitting diodes or any other similar light-emitting devices as would be readily understood by a worker skilled in the art. Furthermore, the term light-emitting element is used to define the specific device that emits the radiation, for example a LED die, and can equally be used to define a combination of the specific device that emits the radiation together with a housing or package within which the specific device or devices are placed. Examples of light emitting elements include also lasers and more specifically semiconductor lasers, such as VCSEL (Vertical cavity surface emitting lasers) and edge emitting lasers. Further examples may include superluminescent diodes and other superluminescent devices.

As used herein, the term "about" refers to a +/−10% variation from the nominal value. It is to be understood that such a variation is always included in a given value provided herein, whether or not it is specifically referred to.

Unless defined otherwise, all technical and scientific terms used herein have the same meaning as commonly understood by one of ordinary skill in the are to which this technology belongs.

According to aspects of the present technology, methods, and processes are provided for disposing one or more materials on one or more target substrates. Depending on the embodiment, the combination of the materials and target substrates may provide a predetermined function relative to, in combination with or without certain system components. Depending on the embodiment, target substrates may be different from the certain system components or they may be the same. Depending on the embodiment, system components and/or target substrates may include or exclude LEEs, sensors, filters or other objects. Depending on the embodiment, target substrates may be associated in a certain manner with other system components, for example by a relative spatial orientation, distance or other operational association. The functions may include electrical, magnetic, mechanical, thermal, optical, chemical, acoustic or other functions. Such functions may be based on corresponding properties or combinations of functions and/or properties provided by the materials, tile target substrates and/or the other system components. Optical properties may include wavelength conversion, such as provided by wavelength-conversion materials, certain refractive index materials including negative refractive index materials as provided by certain metamaterials, or other optical properties, for example. The system may comprise or be configured as a luminaire, sensor, catalytic converter, battery, or other system, for example. It is understood that as described herein and as the case may be, light-converting material may be complemented or replaced with one or more materials other than light-converting material.

As illustrated in FIG. 1, the method 100 comprises providing 110 a target substrate associated with the one or more light-emitting elements. The target substrate may or may not comprise the light-emitting elements. The target substrate may comprise a light-emitting element, packaged set of one or more light-emitting elements, transmissive material optically coupled to one or more light-emitting elements, or the like, as described herein. The method 100 further comprises providing 120 a donor substrate proximate to the target substrate. The donor substrate comprises the light-converting material, and is configured to transfer a portion of the light-converting material to the target substrate upon a predetermined energization of a corresponding portion of the donor substrate. Appropriate donor substrates are described in more detail herein. The method 100 further comprises controllably energizing 130 one or more selected locations of the donor substrate, thereby transferring the light-converting material from the donor substrate to the target substrate at said one or more selected locations, for example in accordance with a predetermined pattern. In embodiments of the present technology, the energization may be performed by a suitable source of visible or non-visible light such as from laser, charged or neutral particles such as ions or other waves and/or particles, or other suitable source of energy. Depending on the embodiment, such a source may be configured to provide energy to one or more substantially focused locations or defined areas of the donor substrate. Depending on the embodiment, the distribution of light-converting material on the donor substrate may be substantially uniform, non-uniform or have a predetermined pattern in thickness and/or lateral extension parallel to the donor substrate, for example. The transfer may be accomplished in a writing or masking manner as described herein.

The method 100 optionally comprises steps of evaluating 140 quality of light from the one or more light-emitting elements associated with the target substrate, evaluating 150 properties of light-converting material associated with the donor substrate, and determining 160 an appropriate pattern based on the evaluations performed in steps 140 and 150. Steps 140, 150, and 160 are optional in some embodiments of the present technology. Evaluation 140 may comprise measuring chromaticity or the spectral power distribution or other quality of the light of the light-emitting elements. Evaluation 150 may comprise measuring chromaticity or the spectral power distribution of light emitted by the light-converting material when subjected to a predetermined input light or other property of the light-converting material. Determining an appropriate pattern 160 may comprise determining an amount and surface coverage of the light-converting material to be applied to provide a desired chromaticity or spectral power distribution or other quality of combined light from the light-emitting elements and light-converting material, given their evaluated qualities.

Manufacturing methods and processes as described herein may be configured to provide predetermined control of the location and amount of disposition of light-converting material at or beyond a predetermined high level, and can be employed to control light conversion and optical path formation within corresponding apparatuses in a predetermined manner. Depending on the embodiment, amounts of light-converting material may be employed that are smaller than those required by conventional manufacturing methods for the manufacture of apparatuses with like properties that are based on like light-emitting elements, for example. This may aid in conservation of rare earth elements, which in turn may limit manufacturing cost. For example, light-converting material on the order of just a fraction of a cubic mm may be needed per apparatus. Furthermore, processes as described herein can provide predetermined chromaticity tolerances and consequently can provide high manufacturing yield in terms of ratio of devices that meet predetermined characteristics versus all devices made by the process. Moreover, unused donor substrate can be reused, for example, it can be reground and blended back into new donor substrate. In comparison extraction of rare earth elements from conventional silicon-gel material is expensive. As such, the quantity of light-converting material and therefore the quantity of rare earth materials included therein may be reduced with suitably configured processes as described herein. Depending on the embodiment, this may aid in the economical deposition of standard as well as new and possibly expensive light-converting and/or other materials.

Figure 2:
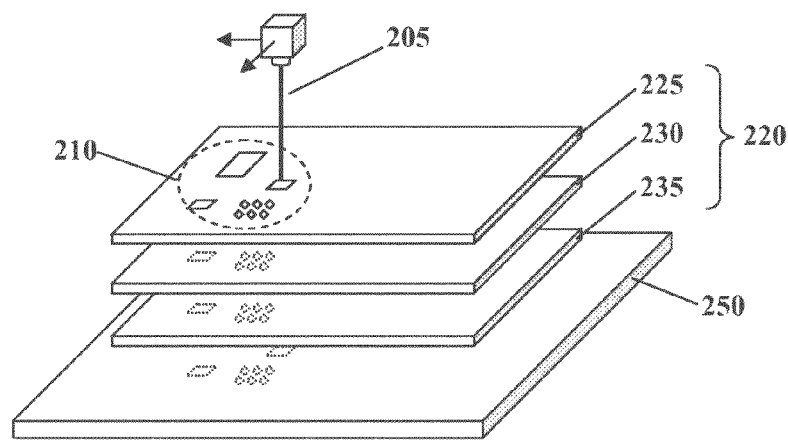
FIG. 2 illustrates aspects related to transferring a pattern of light-converting material from a donor substrate to a target substrate, in accordance with embodiments of the present technology.

FIG. 2 illustrates aspects of transferring of a pattern 210 of light-converting material from a donor substrate 220 to a target substrate 250, in accordance with some embodiments of the present technology. An exploded view of the donor substrate 220 is shown. A laser or other energy carrying beam 205 as further described herein that is incident on the donor substrate 220 controllably traces out the pattern 210 to be transferred. The pattern 210 may comprise discrete pixels of predetermined size, which correspond to substrate locations subjected to laser pulses of a predetermined pulse length and power. Depending on the embodiment, the pattern 210 may comprise a substantially continuous pattern of features. The donor substrate 220 comprises a transparent carrier substrate layer 225, a transfer layer 235 comprising the light-converting material to be transferred, and a release layer 230 between the carrier substrate layer 225 and the transfer layer 235. The release layer absorbs energy from the laser beam 205, and subsequently drives a localized transfer of light-converting material in the transfer layer 235 to the target substrate.

Another aspect of the present technology provides an apparatus for coupling one or more light-emitting elements with a light-converting material. The apparatus comprises an operating area configured to receive a target substrate, the target substrate associated with the one or more light-emitting elements. The operating area is further configured to receive a donor substrate proximate to the target substrate. The donor substrate comprises the light-converting material and is configured to transfer a portion of the light-converting material to the target substrate upon a predetermined energization of a corresponding portion of the donor substrate.

The apparatus further comprises a system of one or more lasers or other suitable energy sources configured to energize one or more selected locations of the donor substrate located in the operating area. The energization initiates a physical and/or chemical reaction that causes a transfer of the light-converting material from the donor substrate to the target substrate at said one or more selected locations. The transfer is typically substantially local to the energization location. The apparatus further comprises a motion system configured to controllably align light from the laser system with the one or more selected locations for energization. The motion system may comprise a support system and various mechanical actuators for controllably providing translational and/or rotational motion of the laser, the operating area, the target substrate, the donor substrate, or a combination thereof. Depending on the embodiment, the apparatus may be configured to manipulate target substrates and/or donor substrates that are configured in endless or batch configurations.

Figure 3:
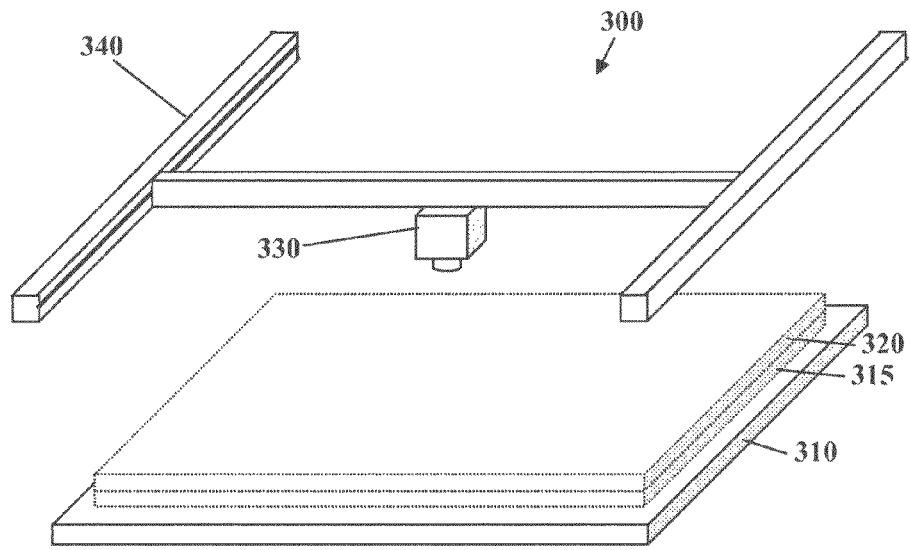
FIG. 3 illustrates an apparatus for coupling one or more light-emitting elements with a light-converting material, in accordance with embodiments of the present technology.

An example apparatus 300, as generally described above, is illustrated in FIG. 3. The apparatus 300 comprises an operating area 310 configured to receive a target substrate 315 and a donor substrate 320 proximate to the target substrate. The apparatus 300 further comprises a laser 330 configured to energize the selected locations of the donor substrate 320 located in the operating area 310. The apparatus 300 further comprises a motion system 340 configured to controllably align the laser 330. As illustrated, the motion system 340 comprises two end support rods, a center support rod which is, movably attached to the end support rods via a track, the laser 330 movably attached to the center support rod via a track.

The laser 330 may be configured to provide one or more spots of light, each having a predetermined shape and size at the operating area 310. The motion system 340 may be configured to permit positioning of the laser light relative to the target with predetermined precision or spatial resolution. Depending on the embodiment, the laser itself or the target may be moved by the motion system 340 to energize and transfer the desired pattern.

According to an embodiment, an example apparatus may be configured to provide a linear array of pixels at which laser light may be directed. Such an apparatus may employ a Kodak Squarespot™ product having approximately 240 pixels in a linear configuration, or other linear array, for example. Depending on the embodiment, the linear array may be configured to provide light across a portion or the entire width of a target substrate or operating area. Such an embodiment may be employed in a web fed or other process. In some embodiments the laser may provide a 2D array of pixels. The target substrate may be stepwise imaged, thereby stitching individual portions of patterns of light-converting material together. Depending on the embodiment, a corresponding motion system may be optional or configured to provide translation of the linear array in only one direction, for example. Translation may be provided along, perpendicular or in another direction relative to the elongate extension of the linear array.

Figure 15:
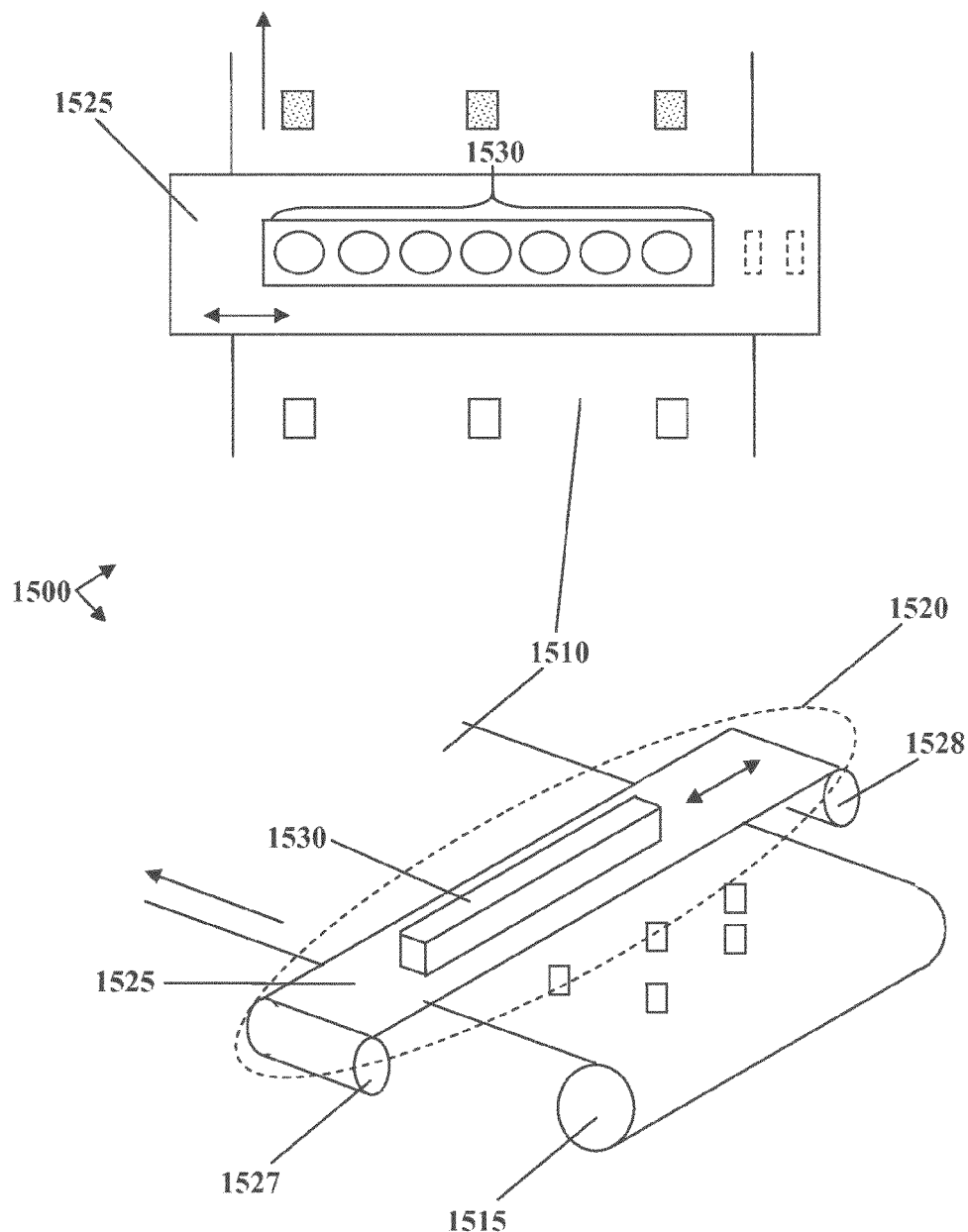
FIG. 15 illustrates a respective top view and a perspective view of a web-fed apparatus for coupling one or more light-emitting elements with a light-converting material, in accordance with embodiments of the present technology.

Another exemplary apparatus 1500, as generally described above, is illustrated in FIG. 15, which shows a top view and perspective view of the apparatus 1500. The apparatus 1500 resembles a web-fed system, comprising or accepting a flexible target substrate 1510 wrapped around and fed between rollers of the apparatus 1500 such as roller 1515. The rollers operate to feed the target substrate through an operating area 1520. The apparatus 1500 further comprises or accepts a flexible donor substrate 1525 wrapped around and fed between rollers 1527 and 1528 of the apparatus 1500. As illustrated, the donor substrate 1525 is fed through the operating area 1520 substantially perpendicularly to the target substrate 1510, although other configurations may also be used. The apparatus 1500 further comprises an array of lasers 1530. Depending on the embodiment, the array of lasers 1530 may comprise one or more lasers, for example, a linear array of adjacent, non-targetable or targetable lasers. Lasers of the array 1530 may be addressed and operated to illuminate nearby portions of the operating area, thus energizing the donor substrate therein. By positioning portions of the target substrate 1510 in the operating area 1520, providing an adequately undepleted portion of donor substrate 1525, and controllably energizing selected portions of the donor substrate 1525 by appropriate control of the laser array 1530, the target substrate 1510 may be patterned with light-converting material in a controllable manner. The apparatus 1500 further comprises computing and control electronics configured for this purpose.

According to some embodiments, the array 1530 comprises plural lasers spaced at predetermined distances so that targeted illumination of the operating area at a desired resolution is achievable by selectively activating the appropriate laser. Depending on the embodiment, energy deposition may be directed in one or more ways in order to provide a predetermined targeting resolution. For example, the array 1530 may be configured, to be movable as a whole, or one or more of the lasers of the array 1530 may be to translatable and/or rotatable, or optics may be employed that can focus the laser beams in one or more predetermined locations.

The rollers 1527 and 1528 operate to feed the donor substrate 1525 into and out of the operating area 1520, such that regions of the donor substrate 1525 which are substantially undepleted of light-converting material are presented to the lasers for energization. These regions, after being depleted by one or more laser energization cycles, are then moved by operation of the rollers 1527 and 1528 so that they are no longer energized. This may comprise moving the depleted regions out of the operating area 1520 altogether, although some localized depleted regions may remain for a time in the operating area 1520 while adjacent undepleted regions are energized. In some embodiments, movement and depletion of the donor substrate 1525 is akin to movement of a typewriter ribbon. Computer vision systems can be employed to update a mapping of the undepleted regions so that a motion control system can maximize the use of the donor substrate. Such updating may be performed in situ, continuously or at predetermined events, for example. In some embodiments, an algorithm may be used to track the locations of depleted regions of the donor substrate, and to position the donor substrate such that only undepleted regions of the donor substrate are energized. A length of donor substrate may thus be used until it is depleted to a point where it is no longer feasible for use. It may be feasible to recycle used donor substrate such that remaining light converting material is extracted for re-use.

Yet another aspect of the present technology provides a lighting device produced by the above method and/or a lighting device produced by a process comprising application of the above method to materials of the donor and target substrates. The lighting device may be a solid-state lighting device with associated light-converting material, a phosphor-coated LED or device comprising same, a module, a lamp, a luminaire, or the like.

Yet another aspect of the present technology provides a lighting device comprising one or more light-emitting elements of a certain size and a pattern of light-converting material. The light-converting material is operatively coupled to the light-emitting elements, for example by applying the light-converting material directly to the light-emitting elements and/or to a transparent or translucent coating, casing, covering, or the like, which is associated with the light-emitting elements. In some embodiments, the light-converting material may be formed in a pattern directly on an LED die, LED wafer. LED package, or other substrate. In some embodiments, the light-converting material may be formed on an optically transmissive layer, housing, encapsulant, or the like, which is optically coupled to one or more light-emitting elements. The pattern comprises one or more features having a second size. The second size may be smaller, substantially equal or larger than the size of the light-emitting elements and/or an image of the light-emitting elements, which may depend on the position of the features relative to the light-emitting elements and/or the distance therebetween. Depending on the embodiment, the pattern may be configured to cover a predetermined portion of the surface to which it is applied, leaving a complementary portion free of the light-converting material. The pattern may be a discrete pixilated pattern or other pattern, and may comprise a single layer of light-converting material such as phosphor, or plural layers of the same or different light-converting materials. Pattern, features may relate, to pixels or groups of pixels, or other shapes of light-converting material. Each layer comprises a predetermined pattern of material, which is configured for example to provide a desired chromaticity of combined light from the lighting device. The pattern or patterns of light-converting material, may be provided by a method or process as described herein, or by another method. In embodiments of the present technology, the pattern features may be custom configured to the light-emitting element, for example to cover a predetermined surface area thereof, thus providing ability of chromaticity tuning of combined light emitted by the right-emitting element and light-converting material.

Embodiments of the present technology employ a thermal or non-thermal transfer process, for example a laser-transfer or other process as described herein. Depending on the embodiment, the transfer process may be configured to make use of addressability, resolution and light output power of a suitably configured imaging or other system to transfer appropriate amounts and types of light-converting and/or other material from one or more donor substrates to a target substrate. The transfer process may employ energy carrying beams of waves and/or particles such as photons, phonons, electrons, ions or other particles with suitable kinetic energies and/or particle masses, or combinations thereof to cause a thermal, non-thermal, sputtering, ablative, electrostatic, ultrasonic, acoustic, detonative, piezoelectric and/or otherwise stimulated transfer of material from a donor substrate onto and/or into the target substrate. Depending on the embodiment, the transfer process may employ one energy-carrying beam or a combination of energy-carrying beams. Combinations of energy-carrying beams may be employed to perform a corresponding, material transfer in one or more stages. For example, one or more of the energy-carrying beams may facilitate an activation of material from the donor substrate, one or more of the energy-carrying beams may be configured to facilitate a spatial transfer of the material and/or one or more of the energy-carrying beams may facilitate an actual disposition of material on the target substrate.

Embodiments of the present technology facilitate fine control over patterning of light-converting materials onto target substrates. For example, in one embodiment, discrete 'pixels' of light-converting material may be reliably transferred to the target substrate using a laser, each pixel having a diameter or edge length of about 10 μm (micrometers). Assuming adjacent pixels of this size in a square grid, a 1000 μm square area of target substrate can be patterned with $2^{10,000}$ different pixel patterns. A variety of pixel patterns, the design and layout of which would be readily understood to those skilled in the art based on the present, disclosure, may be used for patterning selected portions of the area differently, for example to compensate for variability of light intensity emitted by different portions of a light-emitting element or array. Furthermore, the proportion of target substrate covered by light-converting material in this example can be controllably varied from 0% to 100% in 0.01% increments, thus varying coverage from no application of light-converting material to complete coverage of the area. As such, the amount of light-converting material applied, and hence the resulting chromaticity of the coupled light-emitting element and light-converting material can be finely controlled.

Patterns of light-converting material, such as pixellated patterns may comprise one light converting material or overlapping, partially overlapping, or non-overlapping regions of different light-converting materials. Different portions of patterns may abut against each other or be placed in a spaced-apart manner. Spacing between pattern portions may be configured to allow a desired portion of substantially unconverted light from light-emitting elements to escape and mix with converted light to provide a desired chromaticity of mixed light. Spacing between pattern portions may or may not be present. Patterning may also refer to patterns of varying thickness of identical light-converting material. Pixels may be round, square, triangular, hexagonal, or otherwise shaped, and may be patterned in close proximity to form pattern features of substantially arbitrary shape. A regular or irregular tiling of the target substrate may be utilized, with each pixel occupying all or a portion of each tiling element. In some embodiments, overlapping patterns of light-converting material may be used to create gradations in the amount of light converted. A three-dimensional pattern of light-converting material may thus be formed. For example, portions of the pattern corresponding to relatively thinner layers of light-converting material may convert less light than portions of the pattern corresponding to relatively thicker layers, thus varying chromaticity. In embodiments comprising plural light-converting materials, the pattern may be configured to control or limit cannibalization between different light-converting materials. Cannibalization comprises unwanted loss of already converted light in subsequent layers of light-converting material, including absorption and/or conversion at lower quantum efficiencies in subsequent layers, for example.

More generally, for a target substrate having area A square units and a resolution of donor substrate locations of 'pixels' per square unit, a total of $2^{p*d}$ different pixel patterns are possible. Pixels may be arranged in a square grid, or in another pattern such as a hexagonal grid or irregular arrangement. Pixels may be square, circular, regularly shaped and sized, stochastically screened or irregularly shaped and sized. In some embodiments, substantially continuous patterns of light-converting material may be applied to the target substrate rather than discrete pixels. In this case, the concept of 'pixel' may be replaced by or be associated with the concept of minimum achievable feature size of the pattern.

In some embodiments, multiple layers of light-converting material such as phosphors may be applied to a target substrate in an 'overwriting' process. In this process, plural patterned layers of the same type or different types of light-converting material are applied in overlapping or non-overlapping layers to the target substrate. Each patterned layer may be applied sequentially. This provides an additional level of control over the amount, pattern and combination of light-converting material applied, thereby facilitating fine control or tune-ability of the resulting chromaticity of the coupled light-emitting element and light-converting material or materials.

Embodiments of the present technology may optionally comprise, pre-evaluation, of one or both of the light-emitting elements and the light-converting material, and adjustment of the coupling, for example adjustment of the light-converting material pattern, based on the pre-evaluation.

In some embodiments, light-converting material may be applied in a predetermined three-dimensional pattern to a three-dimensional surface of the target substrate. This may be useful to facilitate conversion of light emitted by different types of LEEs as explained herein. For example, such three-dimensional surfaces may include one or more light-emitting surfaces of light-emitting elements and may depend on the type of light-emitting element. Depending on the embodiment, the duration and power of laser or other pulses may be adjusted to achieve a predetermined coating around edges of a light-emitting element, for example.

Types of light-emitting elements may include horizontal, vertical, flipchip or other forms of LEDs, for example. In an example manufacturing process, an epitaxial layer is grown on a sapphire substrate. In this example, the epitaxial layer may be about 3 to 10 microns thick and includes a buffer layer to accommodate thermal expansion and lattice mismatch between the sapphire substrate and the GaN LED structure, which is disposed over top thereof and comprises a n-GaN layer, the active light emitting region and a p-GaN layer. The thickness of the LED die may be about 70 to 250 microns. According to another example for a horizontal LED, an LED mesa is formed on the sapphire substrate and both p and n contacts are formed on the top surface. Light generated in the active region escapes from the LED die through all surfaces.

According to another example for a vertical LED die, the epitaxial layer is removed from the sapphire substrate and bonded to an electrically and thermally conductive substrate. During this process a mirror layer may be incorporated between the new substrate and the epitaxial layer that optically separates the substrate from the active region. One electrical contact is formed on the top and one on the bottom substrate. Depending on the embodiment, the n-contact may be located on the top of the LED die. In this example, light emission substantially occurs through the top surface. Consequently, light-converting material may be disposed and/or concentrated substantially proximate the top light-emitting surface. According to another example for a flip chip LED, both n and p contacts are formed on the top surface and, subsequently, the LED die is flipped and bonded to a target substrate with matching electrical pattern. Optionally, the sapphire substrate may be removed. A flip chip may be configured to provide both electrical contacts on the bottom of the die leaving the entire top surface accessible for placement of optics or deposition of phosphors.

Depending on the embodiment, patterning of light-converting material may be varied across the target substrate to compensate for spatial variability in light emitted by light-emitting elements. Such spatial variability may arise from adjacent or proximate opaque elements such as operative contacts, bonds, metallization patterns or other elements associated with a light-emitting element. Furthermore, shadowing due to metallization contact patterns and variation of light generation across the die may be due to non-uniform carrier densities due to electron and hole injection variation, into optically active regions, which can translate into non uniformity in the photon generation in the active region and variation of the brightness across an LED die, which can lead to an intricate brightness variation across the surface of the LED die, for example. Different amounts and/or types of light-converting materials may be patterned in different regions to at least partially compensate for such spatial variability and achieve greater uniformity of the light emission.

Consequently, light-converting material may be applied in a predetermined three-dimensional pattern to a three-dimensional surface of the target substrate, such as a generally flat substrate with predetermined relief. For example, when the target substrate consists of or comprises a light-emitting element, such as a horizontal LED, which exhibits a significant amount of light emission through facets on the side of the light-emitting element, it may be desirable to achieve transfer of the light-converting material not only to the top surface of the light emitting element, but also to the sides of the light emitting element.

In some embodiments, three-dimensional patterning, such as patterning of side facets of a light-emitting element, may be performed in a number of ways. For example, an area of light-converting material larger than the area of the LED die top surface may be released from the donor substrate, transferred to the die target surface and moulded around the target surface including the sides of the LED die via at least, partial liquefaction. Light-converting material may be released from the donor substrate by melting, evaporation, sublimation, sputtering or other process. Light-converting material may be disposed on the target, substrate via solidification, condensation, implantation and/or other process, for example. Depending on the embodiment, an oversized area of light converting material may be energised and evaporated so that a cloud of light-converting, material is created which wraps around the three-dimensional features and condenses on both the top and side surfaces of the LED die.

In some embodiments, sides of light-emitting elements may be coated with light converting material by aiming and projecting light-converting material at an angle at the light-emitting element. The plane of the target substrate or the laser may by tilted substantially away from an axis perpendicular to the top surface of the light-emitting element, so that light-converting material arrives on a corresponding, side surface substantially to generate a corresponding coating.

Depending on the embodiment, one or more of the target substrate, donor substrate, and sources of energy such as lasers for energizing the donor substrate, may be controllably oriented, so that the donor material can be applied to the target substrate at angles that provide normal or close to normal incidence with respect to the target substrate at that location. Depending on the embodiment, three-dimensional target substrates may be effectively patterned, since greater resolution and/or efficacy can be achieved by applying the light-converting material at a substantially perpendicular angle to the target substrate, in embodiments of the present technology.

Target Substrate

Embodiments of the present technology comprise or relate to a target substrate, which is associated with one or more light-emitting elements, and to which light-converting material is applied, for example in one or more layered patterns. The target substrate may comprise or be optically coupled with a single light-emitting element or plural light-emitting elements. Thus, for example, the target substrate may comprise a set of one or more light-emitting elements, an LED wafer, a planar surface such as a circuit board comprising light-emitting elements thereon, a packaged light-emitting element, a surface comprising light-emitting elements and one or more optically transmissive materials thereon, such as encapsulation layers, an optically transmissive material optically coupled but spaced apart from one or more light-emitting elements, one or more optical components of a system that may be proximate or displaced from the LEEs, or the like. Generally, light-converting material is patterned and/or deposited on a target substrate, and wherein the target substrate receives, conveys, and/or generates light to be transmitted to the patterned light-converting material.

In embodiments of the present technology, the target substrate comprises the one or more light-emitting elements. The target substrate may be an LED wafer, a collection of LEDs (for example from a diced wafer) mounted on a tape, a chip-on-board arrangement of light-emitting elements, a package comprising a single light-emitting element or plural light-emitting elements, an LED package, an LED die, a closely packed array of singulated light-emitting elements such as LED dies on a carrier substrate, a diluted array of singulated light emitting elements such as LED die on a carrier substrate, a light-emitting element comprising a light-converting material applied by another method, or the like. LEDs may be horizontal, vertical, flip-chip, or other types of LEDs. The target substrate may also be or comprise a semiconductor laser wafer, a collection of lasers such as VCSELs on tape, densely or diluted packed on a carrier substrate.

In some embodiments, the target substrate comprises one or more light-emitting elements and further comprises an optically transmissive encapsulant formed over the light-emitting elements. The encapsulant may provide physical protection to the light-emitting elements. The encapsulant may be configured as a suitable surface for receiving and retaining the light-converting material. The encapsulant may provide a thermal barrier between the light-emitting elements and the light-converting material to inhibit breakdown of the latter. The encapsulant may be configured to diffuse and/or filter light from the light-emitting elements. The encapsulant may facilitate planarization of the target substrate. In one embodiment an LED die comprising a profile of protrusions and recesses may be covered by an encapsulant having, a complementarily varying thickness, thus providing a substantially planar surface to the target substrate. In a different embodiment the planarization layer creates a localized plane surface around one of a plurality of light emitting elements, thereby facilitating the transfer of color converting material over an area larger than the individuated light emitting element. The encapsulant may function as a diffusion barrier to protect an LED die from material incorporated in the light-converting material.

Figure 4:
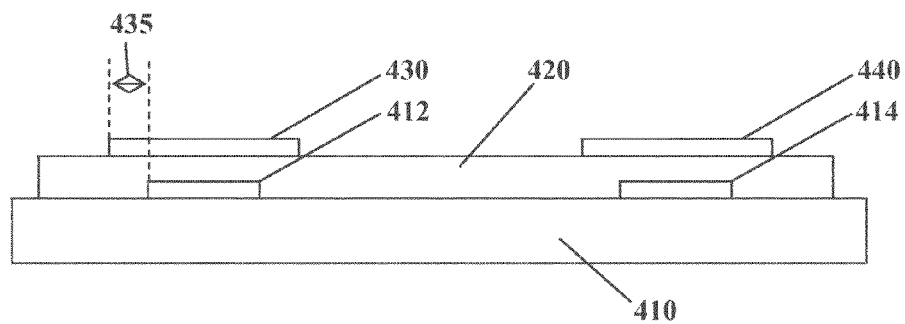
FIG. 4 illustrates a cross-sectional view of a target substrate comprising an encapsulant layer, in accordance with embodiments of the present technology.

FIG. 4 illustrates a cross-sectional view of a target substrate 410 comprising light-emitting elements 412, 414, such as LEDs and an encapsulant layer 420. Patterns of light-converting material 430, 440 are disposed on the encapsulant layer 420. As illustrated, the patterns 430, 440 may be positioned overtop of the light-emitting elements 412, 414. As also illustrated, the patterns 430, 440 may be oversized relative to the light-emitting elements 412, 414, for example such that portions of the pattern 430 extend a distance 435 beyond the edge of the light-emitting element 412.

In some embodiments, a surface of the target substrate is configured to increase receptivity of the light-converting material. For example, the surface may be plasma etched or otherwise textured, or roughened, to increase tackiness, or an adhesive such as silicone or B-staged silicone may be layered on the surface.

Figure 5:
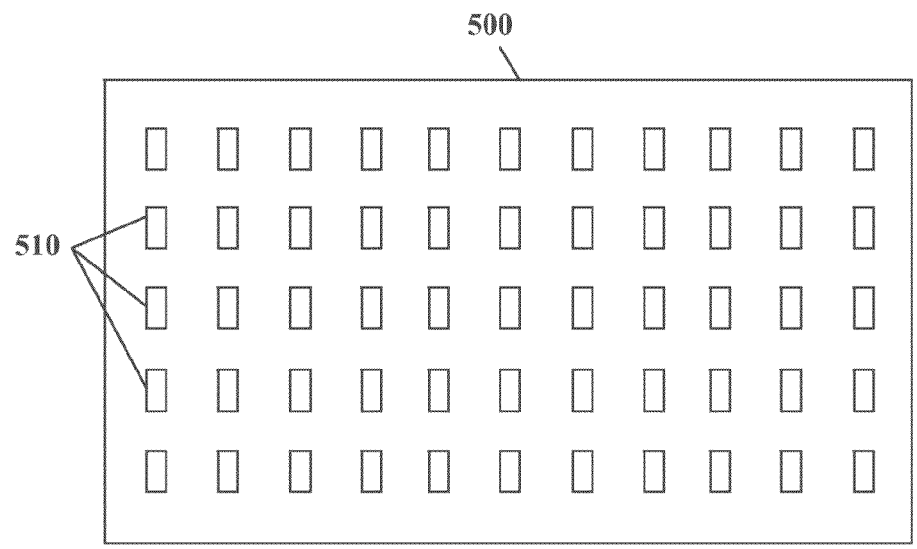
FIG. 5 illustrates a top view of target substrate comprising light-emitting elements in a spaced-apart arrangement, in accordance with embodiments of the present technology.

In some embodiments, the target substrate may comprise plural light-emitting elements adjacent or in close proximity to each other. In some embodiments, the target substrate, with or without an encapsulant such as a diffusing and/or planarizing encapsulant, may comprise plural light-emitting elements in a spaced-apart or diluted arrangement, the light-emitting elements thereby covering a predetermined fraction of the target substrate. The light-emitting elements may be integrated and interconnected on a carrier. For example, light-emitting elements may be spaced several millimeters from each other, and/or may be spaced apart in a regular or irregular pattern. Arrays of such configuration may be used for backlighting or general illumination, for example. FIG. 5 illustrates a top view of target substrate 500 comprising light-emitting elements 510 in a spaced-apart arrangement.

Figure 6:
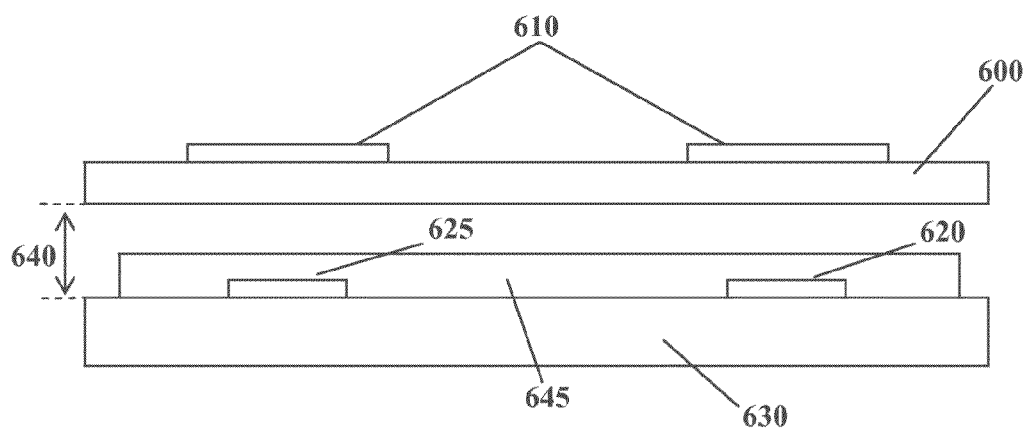
FIG. 6 illustrates a cross-sectional view of a transparent target substrate separated by an air gap from associated light-emitting elements, in accordance with embodiments of the present technology.

In some embodiments, the target substrate comprises an optically transmissive material that is to be registered, at a later time, with one or more light-emitting elements. For example, the target substrate may comprise a sheet of manufactured glass, a transparent thermoplastic such as Polymethylmethacrylate (PMMA), polycarbonate, PET, ULTEM (Polyetherimide), combinations of layers, or other suitable material. The target substrate may overlay an additional substrate carrying light sources, for example an array of phosphor coated or non-phosphor coated LEDs. In some embodiments, the target substrate may be placed at a predetermined distance from the additional substrate, the two substrates being separated by an air gap, for example. FIG. 6 illustrates a cross-sectional view of transparent target substrate 600 comprising a pattern of light-converting material 610 thereon, and associated with light-emitting elements 620, 625 on another substrate 630. An air gap 640 separates the target substrate 600 from the other substrate 630 comprising the light-emitting elements 620, 625. A transparent or translucent encapsulant 645 may also be formed over the light-emitting elements. The target substrate and the light-emitting elements may be substantially precisely aligned within a predetermined tolerance.

In some embodiments, the target substrate comprises one or more flip chip LEDs. In a flip chip LED the optical emission occurs through the top surface, while electrical interconnects are provided on the opposite surface of the LED. Such a topology can enable up to the entire top surface of a flip chip LED to be covered with light-converting material depending on the embodiment.

In some embodiments, the target substrate comprises one or more vertical LEDs. In this case, the LED surface area to which light-converting material may be applied is reduced by the area required to provide electrical connection to the vertical LED through wirebonding or other process known to a person skilled in the art.

In embodiments of the present technology, LEDs may be LED dies such as horizontal, vertical or flip chip LED dies, LED packages, chip on board LEDs, or the like.

Donor Substrate

Embodiments of the present, technology comprise or relate to a donor substrate configured to transfer a portion of a light-converting or other material to the target substrate upon a predetermined energization. The donor substrate may be placed in contact with, proximate or distal of the target substrate and stimulated via a laser or other source as described herein in a predetermined pattern. Those sites on the donor substrate that are adequately stimulated may react by transferring light-converting material, held in the donor substrate, to the target substrate.

According to some embodiments, the donor substrate may be placed over top of the target substrate as a contiguous layer. A template may be placed overtop of the donor substrate, or between the donor substrate and target substrate, the template having apertures defining general regions where the transfer of light-converting material is to occur. The template and/or donor substrate may be mechanically separate, substantially flat substrates, or they may be temporarily bonded onto or disposed, via a suitable mechanism, proximate or distal of the target substrate, for example in accordance with lithographic techniques as would be readily understood by a worker skilled in the art.

In some embodiments the donor substrate is comprised of plural layers, including a carrier substrate layer, a transfer layer, and a release layer, as described below. The transfer layer is located nearest to, for example adjacent to, the target substrate, while the release layer is located between the carrier substrate layer and the transfer layer. In some embodiments, a single integrated layer may function as both the transfer layer and the release layer. For example, materials of the transfer layer and release layer may be substantially intermixed. The integrated layer may operate similarly to that described herein with respect to separate transfer and release layers.

The carrier substrate layer may be formed of a material that is inert to the transfer process, for example by virtue of transparency to the laser or other light-energy source. For example, the carrier substrate may comprise glass, polyethylene terephthalate (PET), polymethylmethacrylate (PMMA), or the like. In some embodiments, the carrier substrate layer may comprise an antireflection coating, so that incident laser light is not substantially reflected when it strikes the carrier substrate layer.

The transfer layer comprises one or more light-converting or other materials or precursor materials thereof. The transfer layer may include light-converting material only or may comprise light-converting material suspended in another material such as a silicone elastomer. The transfer layer may comprise plural light-converting materials, in some, embodiments, plural light-converting materials may be mixed together. In some embodiments, different light-converting materials may be confined to different regions of the transfer layer, or be present in different concentrations in different regions.

According to some embodiments, the transfer layer comprises a B-staged silicone. The B-staged silicone layer may provide a partially cured layer, which may be configured to re flow upon thermal actuation, for example, by a laser. The layer may thus behave as a thermoplastic layer, in this way, the silicone is earned to the target substrate, for example LEDs thereof, in a partially cured and plastic state. The partially cured silicone layer may then be further or fully cured by a subsequent process step to achieve a predetermined degree of polymerization.

In some embodiments, the transfer layer comprises the light-converting material along with a binder material, such as B-staged silicone (to confer tackiness to the transferred silicone), a diffuser material such as silica, fumed silica, finely divided glass particles, or Aluminum Oxide $Al_2O_3$, or a combination thereof. Depending on the embodiment, the transfer layer may include thixotropic control materials such as fumed silica, which can help maintain light-conversion material in suspension during the transfer process and control coagulation. In some embodiments, the binder material may aid in binding the light-converting material with the target substrate. In some embodiments, the binder material aids in binding the light-converting material with the donor substrate until sufficient energization. The diffuser material may act as a scattering center, thereby aiding blending and mixing of the emitted light by increasing the path length of the rays within the layer.

The release layer is configured to initiate transfer of the light-converting material to the target substrate upon energization, for example via a laser light source. Generally, the release layer is configured to physically and/or chemically drive direct transfer of light-converting material to the target substrate when energized locally by a suitable energy source. The release layer may undergo a chemical reaction, a physical state change, a change in temperature, or the like, or a combination thereof. In some embodiments, referred to herein as a thermally-activated process, the release layer may be configured to convert energy due to the energization into heat. The heat may then be used to drive the transfer of light-converting material to the target substrate. In some embodiments, referred to herein as a photon-activated process, the release layer may be configured to decompose upon energization, for example due to a UV laser.

In some embodiments related to the thermally-activated process, the release layer may comprise an absorbing material such as a continuous layer of metal oxide, black aluminum, or other suitable material that converts electromagnetic energy in a predetermined spectrum to heat. The absorbing material may be embedded as a powder within the release layer or coated onto the carrier substrate, for example.

In some embodiments related to the thermally-activated process, the release layer may comprise material that is capable of nitrogen production at a temperature, such as an organic azide. This material may be applied as a continuous layer or as intermixed with a heat absorbing material. Upon energization via an IR laser beam, the heat absorbing material converts the light into heat, which stimulates localized nitrogen gas production by decomposition of the organic azide. The produced gas causes an expansion, which propels a corresponding localized portion of light-converting material toward the target substrate.

In some embodiments related to the thermally-activated process, the release layer comprises an absorbing material, and the transfer layer comprises the light-converting material along with a binder material that is configured to liquefy at a predetermined temperature. Such binder materials may include B-staged silicones, PET, PMMA, Poly-m-methoxytoluene (PMMT), Polyester, Polycarbonate, polyolefins, Polyamide, or other materials. Upon energization, the materials in the transfer layer will liquefy, thereby facilitating transfer of the light-converting material to the target substrate. The target substrate may be configured to bind to the liquefied materials, or to receive them under diffusion, gravity, electrostatic attraction, bonding to activated surface states or the like.

In some embodiments related to a photon-activated process, chemical bonds in materials, such as materials in the donor substrate release layer, are broken due to the photon energy rather than thermal effects. Such materials in the release layer may thereby be configured to decompose upon irradiation with near UV light. Once bonds in the release layer are broken, the light-converting material in the transfer layer may tend to be attracted to the target substrate. Attraction may be due to effects such as gravity, chemical attraction, electrostatic attraction, adhesive binding, or the like. In some embodiments, an organic azide can be induced to decompose by photon energy or thermal energy.

As will be readily understood, the donor substrate is typically configured so that transfer of light-converting material is substantially local to a predetermined energization. For example, a laser beam incident on a first, region of the donor substrate may drive transfer of light-converting material contained in the first region, possibly along with light-converting material in a second region surrounding the first region. The second region may be controllably limited in its cross-sectional area, thereby improving resolution of the transfer process.

In an exemplary embodiment, the transfer layer comprises a polymeric material containing light-converting material in the form of phosphor particles having mean particle diameters of between 3 μm and 10 μm. Other diameters may also be used. The weight percent of light-converting material such as phosphor particles in the donor substrate may be of various amounts, limited at the upper end for example by the ability of the polymer substrate to retain its shape and/or integrity. Sufficient binder material should be present to retain integrity of the substrate. The polymeric layer may be a silicone rubber sheet, which is of optical quality transparency. More specifically a B-staged silicone rubber sheet may be used, which is not fully cured, as would be readily understood by a worker skilled in the art. The purpose of the B-staging of the silicone is to confer thermoplastic, and tackiness properties to the transferred silicone drops. If the silicone is not B-staged, the silicone can behave as a thermoset material, limiting the case of coating the light emitting elements. In some embodiment, the sheet thickness may be between 30 microns and 1 mm. In some embodiments, the sheet thickness is on the order of the pixel size of the pattern of light-converting material. In some embodiments, the sheet thickness is selected so that thermally-induced transfer of light-converting material can be adequately carried out using an energy source, such as a laser, of a given power. The sheet is laminated onto a carrier substrate layer of glass, PET, PMMA, Polyester, Polycarbonate or other substrate. In some embodiments a layer of absorbing material such as metal oxides may be placed between the carrier substrate and the sheet. Upon laser energization the transfer layer is liquefied and subsequently at least a portion thereof is transferred to the target substrate.

In some embodiments, the donor material may include a composition of particles of light-converting material and additional materials such as transparent glass particles in dimensions and densities that provide adjustable spacing between light-converting material particles. Suitable glass particles can be made in a variety of sizes and shapes that can be employed in industrial processes. If the glass particles and light-converting material particles are heated such that the glass particles begin to soften and flow then it may be optionally possible to fuse the materials together within a composite structure with useful mechanical and optical properties. This structure may be controlled in terms of spacing of the constituent particles such that the ratio of distances between light-converting material particles and the intervening free space for propagation of light is balanced to provide a predetermined utilization of light-converting materials and for example, maximize the overall optical throughput through the resulting material matrix. If the composite material is then placed on a carrier layer and the release layer is energized, then the efficacy of removal of light-converting material may be improved as the glass bonds may be broken preferentially through energization within a boundary of a region which creates a substantially homogenous section of composite light-converting material to be released to the target substrate.

In some embodiments, the glass particles may be primarily located on one, or both, of the top and bottom surfaces of the light-converting material layer. If the glass particles are fused together then they can be used to create a protective layer on one, or both sides of the light-converting layer. At an appropriate temperature, the glass particles can be softened and flow together and slightly into the light-converting material. This layer will also create a mechanical association to many light-converting material particles such that they can retain their consistency after the release layer is energized and also provide a degree of protection to the light-converting material particles.

According to some embodiments, the donor substrate can optionally be made of glass where the light-converting particles are heated and allowed to be adhered to the surface to some depth. This provides a convenient mechanical substrate and protective barrier. If this substrate is chemically or mechanically scored with a fine pattern of cleave lines then this may enable a convenient removal via energization of a release layer of a platelet of light-converting material. The overall stack structure presented to the target substrate would be a bonding layer over the light-converting layer which in turn is in contact with the thin glass layer that is adhered to the target substrate. Optionally, the glass donor substrate could be patterned with predetermined relief structures such as lenses or other optically active surfaces to re-direct or enhance light emission profiles.

In some embodiments, when the light-emitting elements of the target substrate emit high-intensify, short-wavelength blue light, the use of silicone or silicone-based polymers is preferred, insofar as such polymers are resistant to decomposition under this type of light.

Transfer Process

In embodiments of the present technology, one or more light-converting or other materials, each having its own predetermined characteristics. Such as photoluminescent characteristics giving rise to a predetermined chromaticity, are transferred from a donor substrate onto a target substrate via a suitable transfer process. Embodiments of the present technology may employ a thermal or non-thermal transfer process, for example a laser-transfer or other process as described herein. Depending on the embodiment, the transfer process may be configured to make use of addressability, resolution and light output power of a suitably configured imaging or other system to transfer appropriate amounts and types of light-converting and/or other material from one or more donor substrates to a target substrate. The transfer process may employ waves and/or particles such as photons, phonons, electrons, ions or other waves and/or particles with suitable kinetic energies, or combinations thereof to cause a thermal, non-thermal, sputtering, ablative, electrostatic, ultrasonic, acoustic, detonative, piezoelectrically actuated, and/or otherwise stimulated transfer of material from a donor substrate onto and/or into the target substrate.

Depending on the embodiment, the transfer process may be performed by exposing predetermined small or large portions of donor substrate to one or more beams of suitable waves and/or particles as described herein. One or more beams may be configured with a width small enough to transfer a pattern in a sequential manner, which may also be referred to as writing. Or one or more beams may be wide enough to expose large portions of the donor substrate in combination with a suitably configured mask that is adequately disposed relative to the donor substrate and the target substrate, or a pre-structured donor substrate to transfer at least large portions of a pattern in a substantially simultaneous fashion, which may also be referred to as masking.

A laser or otherwise induced transfer process may utilize various techniques that would be readily understood by a worker skilled in the art. Those techniques include but are not limited to ablative processes, melt stick processes or a Xerographic or electrostatic process. In an ablative process, a material absorbs energy at the wavelength of an incident laser or other light-energy source. The energy may be converted into heat and result in ablation of a material, such as a material in the release layer. The ablation may remove binder material in the donor substrate through chemical decomposition and/or destructive charring of the donor substrate, allowing the light-converting material to instead bind to the target substrate. A melt stick process refers to a process whereby a thermoplastic substrate is raised above its melting point and melted droplets are removed from the donor substrate.

In an exemplary Xerographic or electrostatic process, a laser is used to remove previously deposited electrostatic charges from portions of a carrier substrate. The charges may be removed in a latent pattern or in a negative of the latent pattern. Powdered material containing the light-converting material, optionally associated with electrostatically active particles, is introduced and attracted to the carrier substrate in the desired pattern. The target substrate is then brought into proximity with the carrier substrate, and the patterned light-converting material is transferred to the target substrate. Subsequent steps may be performed to more permanently affix the light-converting material to the target substrate. Such processes, their steps, and their variants are generally understood in the art and are not described in further detail here. In some embodiments of the Xerographic process, a powder, which comprises a sublimable or meltable material such as PVC along with light-converting material, is sublimed or melted on to the target substrate. Also for Xerographic processes, the light-converting material particles must be adequately responsive to electrostatic manipulation. Since most known phosphors are relatively dense, this may pose a challenge unless a large amount of charge is used. Other light-converting materials such as quantum dots may be less dense and thus more amenable to electrostatic manipulation.

In some embodiments of a Xerographic process, light-converting material is electrostatically attracted to a rotating drum, where the locations of attraction are defined by a laser, through prior laser-based removal or deposition of charges to the drum. The resulting pattern of light-converting material on the drum is then transferred to a transparent sheet, which is the target substrate. This may be done for each light-converting material "color" just like for standard color printing. The light-converting material is then fixed, such as by curing a binder on the transparent sheet, and the sheet is then laminated over one or more light-emitting elements.

In some embodiments, the transfer can be facilitated using a thin release layer that contains nitrogen. The laser heat activates the nitrogen and propels particles of light-converting material away from the release layer. The receiving surface may then have a thin silicone layer sprayed over it to retain the phosphor in place.

Figure 7A:
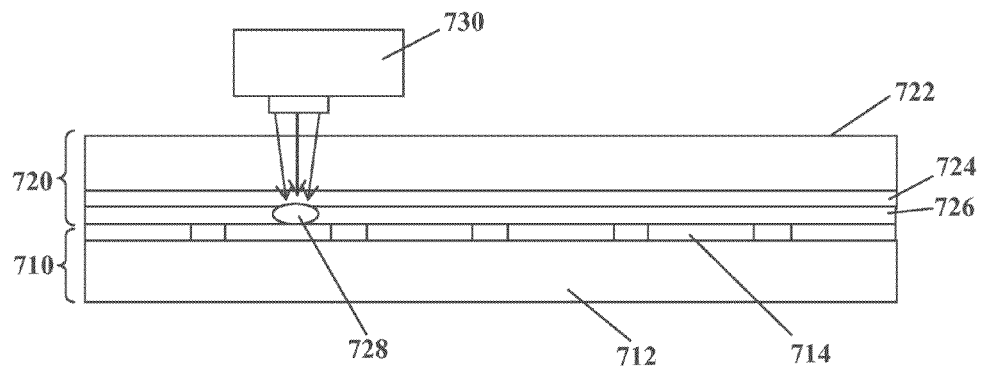
FIGS. 7A and 7B illustrate, in cross section, aspects of a transfer process provided in accordance with embodiments of the present technology.
Figure 7B:
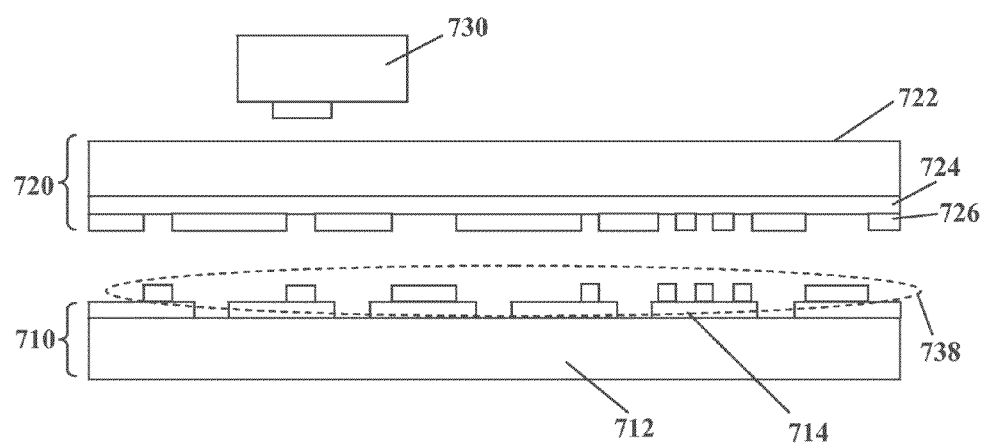

FIGS. 7A and 7B illustrate, in cross section, a transfer process in accordance with an embodiment of the present technology. A target substrate 710 is provided comprising plural light-emitting elements such as LED 714 on a substrate 712. A donor substrate 720 is placed in contact with the target substrate 710 such that a transfer layer 726 of the donor substrate 720, comprising light-converting material, is adjacent to the target substrate 710. The donor substrate 720 further comprises a release layer 724 and a carrier substrate layer 722. A high-resolution imaging head 730, such as ah ultraviolet or infrared laser mounted to a movable platform, is used to irradiate portions of the release layer 724, such as portion 728. Irradiation of the release layer 724 drives a transfer of light-converting material from the transfer layer 726 to the target substrate 710. Specifically, light-converting material is transferred locally at the irradiated portions, such a portion 728, resulting in a pattern 738 of light-converting material being transferred. The pattern may be adjusted, for example to cover a controllable portion of the target substrate, thereby adjusting combined light emitted by the light-emitting elements and light-converting material.

Pre-Evaluation

Some embodiments of the present technology comprise pre-evaluation of one or both of the light-emitting elements and the light-converting material and/or other material, and adjustment of aspects of the coupling between them based, on the pre-evaluation. Sets of light-emitting elements and/or batches of light-converting material, for example associated with sheets of donor substrate, may be pre-evaluated by directly or indirectly measuring characteristics such as chromaticity or other optical properties. Based on this, an appropriate pattern, surface coverage and/or thickness of light-converting material, optionally along with selection of one or more appropriate light-converting materials or particular sheets of donor substrate may be selected, for example via a lookup table operation or via algorithm. The pattern may be selected based on the proportion of the target substrate covered by said pattern. Thus, for example, the pixel density or amount of patterned light-converting material can be adjusted to compensate for chromaticity variation in the light-emitting elements, light-converting material, or both. An adequately high-resolution patterning process may be used to adequately finely tune the chromaticity of the combined light-emitting elements and light-converting materials. For example, the amount of surface area covered by the pattern may be adjustable pixel-by-pixel, where each pixel covers an area of 10 μm by 10 μm. Depending on the embodiment, pre-evaluation may provide for efficient utilization of light-converting and/or other material.

In some embodiments, each light-emitting element, such as each LED wafer or LED die, can be evaluated with respect to chromaticity or other relevant variable. Evaluation may be performed according to current evaluation procedures known in the art, for example related to LED binning in bulk manufacturing processes. An algorithm may be used to determine an appropriate type, amount and pattern of light-converting material to be applied to the light-emitting element to achieve a chromaticity target. Furthermore, the properties of the light-converting material or materials and the interaction of these in proximity to the LED die may be measured, characterized, and factored into an algorithm or means to select the quantity and type of material to be applied to achieve a target chromaticity.

In some embodiments, each light-emitting element may be evaluated individually and an appropriate type and pattern of light-converting material may be applied based at least in part on said evaluation.

In some embodiments, properties of one or more representative and statistically relevant samples of light-emitting elements from a group, such as a manufacturing batch, wafer or batch of wafers, may be evaluated. Such properties may include chromaticity or other properties of the light-emitting elements. Properties of other batches or wafers that have not been evaluated may then be predicted within certain tolerance levels. Such a prediction may be based on statistics, take into account performance patterns based on the manufacturing equipment and processes and/or other aspects, for example. Performance patterns may be used for evaluating samples of sections of wafers or entire LED wafers, for example. An appropriate type and pattern of light-converting material may be applied based at least in part on said evaluation.

In one embodiment, a sample of light-converting material may be evaluated by applying it one or more test patterns to a target substrate associated with a light-emitting element with known characteristics, such as chromaticity. The output of combined light may be analyzed to determine the properties of the sample of light-converting material. Light-converting material from the batch may be applied in appropriate patterns based at least in part on said evaluation.

In some embodiments, where possible, quantities of light-converting material, such as associated with a specific donor substrate, may be evaluated individually to determine properties such as chromaticity, and a pattern in which that quantity of light-converting material is applied may be based at least in part on said evaluation.

For example, an algorithm may receive as inputs the measured chromaticity of a light-emitting element and a desired chromaticity of the combined light-emitting element and light-converting material applied thereto. The algorithm may further receive as input the availability and characteristics of one or more available donor substrates, for example related to the type of light-converting materials of each substrate and/or evaluated characteristics of same. The algorithm may calculate a patterning solution or perform a table lookup to determine a patterning solution. The patterning solution may include one or more particular donor substrates and/or particular light-converting materials to apply to the target substrate. The patterning solution may include a specification of patterns in which specified light-converting materials are to be applied to the target substrate, and/or a specification of proportions of the target substrate which are to be covered by specified light-converting materials. The patterning solution may include a specification of patterns of plural layers of light-converting materials to be applied to the target substrate. Plural layers may comprise similar or different light-converting materials in overlapping or non-overlapping patterns.

In some embodiments, the algorithm may be adjusted in real-time based upon process parameters acquired in situ to further fine tune the application of material. As patterns are applied in the process, in-process testing may be used to measure changes in the output parameters and provide, feedback into the process that adjusts the process to avoid any drift in quality.

As described above, pre-measurement and subsequent adjustment of light-converting material selection and patterning based thereon can facilitate manufacturing of products having more precise and/or consistent characteristics, such as chromaticity. This may be used to compensate for variabilities in sourced light-emitting elements to be patterned, as well as sourced light-converting materials. The high resolution with which the patterns of light-converting material can be adjusted allows for production of a highly consistent product even when sourced materials are relatively inconsistent. In some embodiments, single or multiple rounds of feedback can be implemented. In each round, the product is evaluated and an appropriate light-converting material and/or pattern is determined for bringing the product closer to a desired set of characteristics of emitted light.

Substrate Registration

In embodiments of the present technology, the target substrate is registered with respect to its presence, position and/or alignment relative to an energization source such as a laser. This facilitates accurate patterning of light-converting material onto the target substrate. A position of the target substrate may be measured relative to a baseline coordinate system, so that physical offsets between the target substrate and the baseline coordinate system may be compensated for, thereby reducing potential for pattern misalignment and hence improving accuracy of chromaticity or other aspect of the resulting product. Registration may be performed via an optical system such as a machine vision system, via mechanical sensors, or a combination thereof.

Pattern Selection

In embodiments of the present technology, the pattern is configured to cover a portion of the target substrate commensurate with a desired chromaticity. As will be readily understood, the chromaticity of light resulting from the combined operation of light-emitting elements and light-converting material depends in part on the proportion of target substrate covered by light-converting material. For example, for a target substrate associated with a blue LED light-emitting element, increasing the area of the target substrate occupied by yellow phosphor (which luminesces in the presence of the blue LED) will adjust the resultant combined chromaticity toward that of the yellow phosphor and away from that of the blue LED. Each incremental increase in area of yellow phosphor will adjust the chromaticity by a corresponding incremental amount. In some embodiments, the pattern is configured based on measured or anticipated spatial variation in light emitted by the light-emitting elements. The pattern may thereby be configured to compensate for chromaticity and/or luminance variations related to the target substrate, thereby providing a more uniform combined light output.

Figure 8A:
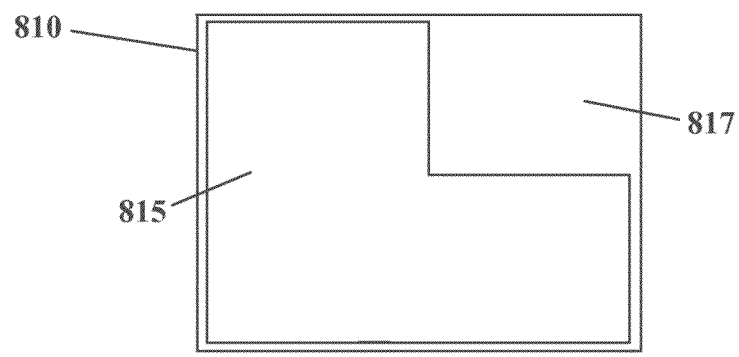
FIG. 8A illustrates a top view of a target substrate having a light-converting material applied in a substantially contiguous pattern, in accordance with embodiments of the present technology.

In some embodiments, the pattern is configured to cover a substantially contiguous portion of the target substrate. For example, a contiguous half, third, or other fraction of the target substrate may be covered in a continuous manner. In some embodiments the entire, target surface may be covered. FIG. 8A illustrates a top view of a target substrate 810 such as an LED die, onto which a light-converting material such as phosphor has been applied in a substantially contiguous pattern 815. A portion 817 remains substantially un-patterned. Subsequent layers of light-converting material may be applied overtop of portions of the pattern 815 and/or portions of the un-patterned portion 817.

Figure 8B:
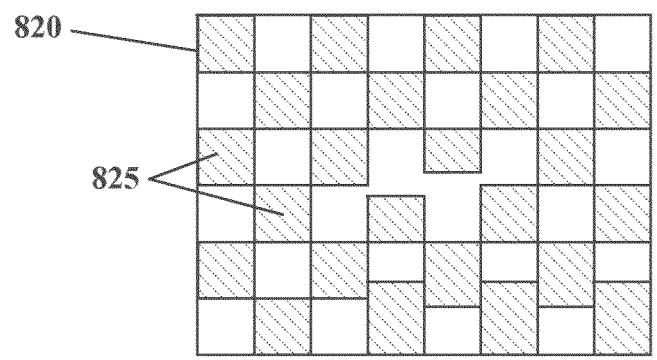
FIG. 8B illustrates a top view of a target substrate having a light-converting material applied in a 'checkerboard' pattern, in accordance with embodiments of the present technology.

In some embodiments, the pattern is configured to cover a predetermined portion of the target substrate in a substantially non-continuous pattern. For example, the pattern may be deposited in a rectangular pattern, circular pattern, checkerboard pattern, meandering pattern, or other pattern comprising plural regions of patterned light-converting material intermixed with plural regions without said light-converting material. The regions without light-converting material may be patterned with another light-converting material, or they may remain substantially free, of patterned light-converting material. FIG. 8B illustrates a top view of a target substrate 820 such as an LED die, onto which a light-converting material such as phosphor has been applied in a. 'checkerboard' pattern 825. A portion of the substrate 820 complementary to the 'checkerboard' 825 remains substantially unpatterned. A checkerboard pattern comprising square features will cover 50% of the target substrate. By also patterning parts of the unpatterned portions, a greater amount of the target substrate 820 may be covered with light-converting material. Similarly, a lesser amount of the target substrate 820 may be covered with light-converting material by refraining from patterning parts of the "checkerboard" 825.

Figure 8C:
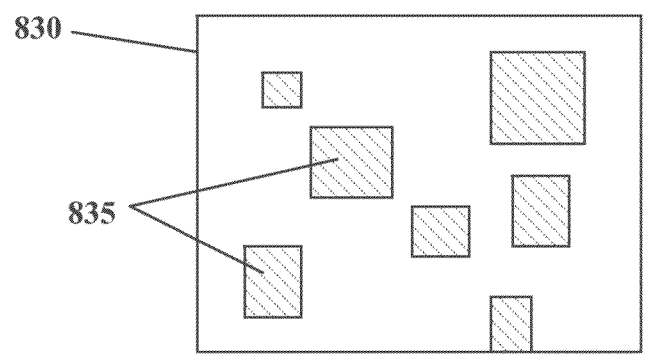
FIG. 8C illustrates a top view of a target substrate having a light-converting material applied in an irregular pattern, in accordance with embodiments of the present technology.

In some embodiments, both the size and location of portions of the pattern may be varied, for example statistically, in order to avoid more effects or other optical artifacts arising from placement of the light-converting material. FIG. 8C illustrates a top view of a target substrate 830 such as an LED die, onto which a light-converting material such as phosphor has been applied in a pattern 835 having features of variable size and positioned in a substantially irregular manner. A portion of the substrate 830 complementary to the pattern 835 remains substantially unpatterned. Statistical algorithms for covering a desired portion of the target substrate with light-converting material, such that the pattern displays feature sizes falling within a desired range and commensurate with a desired statistical distribution, and/or the pattern displays spacings between features falling within a desired range and commensurate with a desired statistical distribution, would be readily understood by a worker skilled in the art. Randomized or pseudo-randomized patterns may be generated as needed, or pre-generated and drawn from a database of patterns as needed.

Placement-Tolerant and Placement-Sensitive Patterns

In embodiments of the present technology, patterns of light-converting material may be applied to the target substrate via one or more predetermined pattern templates. A pattern template may be employed to facilitate conversion of light of one or more light-emitting elements by applying light-converting material provided by a pattern template that is adequately positioned and oriented relative to the corresponding one or more light-emitting elements. By rotating the pattern template, the applied pattern of light-converting material can be rotated. By moving the pattern template relative to the target substrate, the pattern of light-converting material can be applied to a different section of the target substrate.

As an example, a pattern template can be employed in combination with a set of corresponding instructions for energizing a donor substrate at a predetermined set of locations in accordance with certain characteristics of the pattern template. By displacing and/or rotating the target substrate relative to the donor substrate and pattern template, the applied pattern, can be correspondingly displaced and/or rotated. By adjusting the set of instructions in accordance with a linear transformation, the pattern template itself may be translated and/or rotated relative to the donor substrate.

In some embodiments, the pattern template has a larger area than the target substrate. In this case, the pattern could be applied only where the pattern template, overlies the target substrate. In some embodiments, a machine vision or similar system may be used to locate the edges of the target substrate, so that light-converting material is conserved and effectively used, and is not applied off of the substrate and onto an operating area or optically inactive carrier surface associated with the target substrate. In some embodiments, the light-converting material may be applied off of the target substrate, for example onto an operating area surface or optically inactive carrier. Excess deposits from such application may be recycled or reused to limit wastage of light-converting material.

In some embodiments, the pattern template has a larger area than a relevant portion of the target substrate associated with a light-emitting element. For example, when the target substrate comprises or is associated with dilute light-emitting elements, relevant portions may include regions directly above such light-emitting elements, possibly along with directly adjacent regions. In this regard, it is noted that light-converting material may capture and convert rays of light even if they are not directly above a light-emitting element, for example in embodiments comprising light diffusers and/or non-collimated light sources. Such a pattern may be deposited in accordance with the entire pattern template, provided that the pattern template does not fall off the edge of the target substrate.

Although the pattern template may be larger than the target substrate, or relevant portion thereof, features of the associated pattern are typically substantially smaller than a corresponding target substrate or relevant portion thereof.

Patterns applied via pattern templates may exhibit a predetermined amount of placement sensitivity. Placement sensitivity is generally defined as the amount by which a predetermined aspect of resultant light, such as chromaticity of combined light from light-emitting elements and light-converting material, is affected by variations in alignment and/or rotation of a pattern, as applied by a pattern template, relative to the target substrate or portion or portions thereof. For example, chromaticity generally varies with the proportion of target substrate, or relevant portion thereof, covered by a predetermined light-converting material. Placement sensitivity may thus be related to the amount by which this proportion changes as the pattern alignment and/or rotation varies. This type of placement sensitivity is referred to herein as proportion placement sensitivity, and typically relates to a pattern of a template which is oversized relative to the target, substrate or relevant portion thereof.

If placement sensitivity of a pattern is relatively low, the pattern may be referred to as being placement-tolerant. If placement sensitivity of a pattern is relatively high, the pattern may be referred to as being placement sensitive.

It is also noted that placement sensitivity may depend on the type of alignment variation. Thus, a pattern may be sensitive to horizontal displacement, vertical displacement, rotation, or a combination thereof. Furthermore, a pattern may be placement sensitive when subjected to one type of alignment variation and placement tolerant when subjected to another. Furthermore, in some embodiments, a pattern may be placement-tolerant when subjected to displacement within a first range and placement-sensitive when subjected to displacement beyond said first range, or vice-versa.

In embodiments of the present technology, placement-tolerant patterns may be used to facilitate manufacturing, since predetermined characteristics of the combined light may be substantially achieved even if the target substrate and pattern template are potentially subjected to misalignment during manufacturing. Such misalignment may occur randomly due to limitations in mechanical registration of the target substrate in the operating area, for example, or due to vibrations of a continuous roller target substrate feed, for example of a web-fed apparatus.

In embodiments of the present technology, placement-sensitive patterns may be used to facilitate improved manufacturing, by providing a means for controlling aspects of resultant light, such as chromaticity, of a manufactured product. For a proportion placement sensitive pattern, the placement-tolerant pattern may be configured such that varying placement of the pattern on the target substrate by a predetermined amount will result in a corresponding and predictable variation in the amount of light-converting material in the pattern which is operatively coupled to the light-emitting elements associated with the target substrate. For example, the amount of light-converting material may vary linearly with a horizontal displacement in a predetermined manner. This may in turn result in a corresponding and predictable variation in characteristics, such as chromaticity, of the combined light. In this embodiment, characteristics such as chromaticity of the combined light may be controllably adjusted by adjusting alignment between a pattern and the target substrate and/or light-emitting elements or elements associated therewith.

In some embodiments, a machine vision system may be used to adjust relative alignment of the pattern template and target substrate, thereby adjusting amount of light-converting material deposited for a proportion placement sensitive pattern. Light-converting material may thus be deposited in the same pattern for a batch of target substrates, but with placement variations used to control chromaticity (for example when used along with pre-characterization), rather than a more computationally intensive process of re-adjusting the entire pattern for each target substrate.

Figure 9:
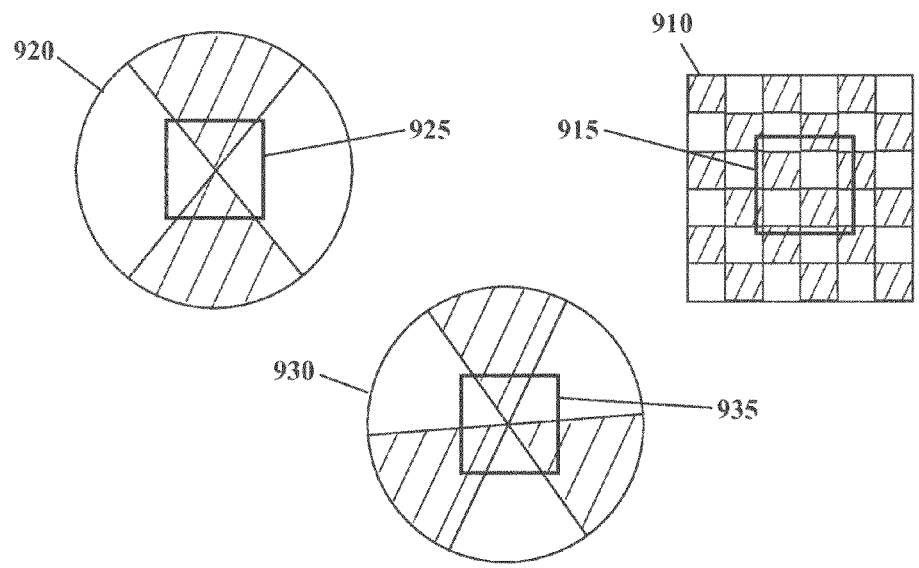
FIG. 9 illustrates exemplary placement-tolerant patterns, in accordance with embodiments of the present technology.
Figure 10:
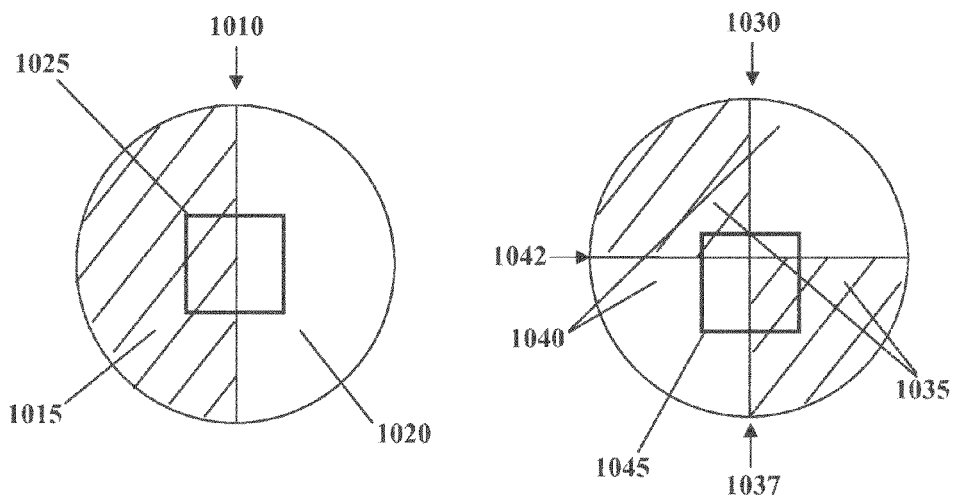
FIG. 10 illustrates exemplary placement-sensitive patterns, in accordance with embodiments of the present technology.

Examples of patterns of varying, proportion placement sensitivity are illustrated in FIGS. 9 and 10. FIG. 9 illustrates a checkerboard pattern template 910 located overtop of a target substrate or portion thereof 915, such as an LED chip. FIG. 9 also illustrates first and second radial pattern templates 920, 930, located overtop of similar target substrates or portions thereof 925, 935, respectively. A pattern of light-converting material is formed in accordance with the pattern templates 910, 920, 930 at least where those templates overlie the corresponding target substrates or portions 915, 925, 935, respectively. Where the templates extend beyond the boundaries of their underlying target substrates, the pattern is not formed, since there is no substrate on which to deposit material. Where the target, substrate is associated with spaced-apart light-emitting elements, the patterns may optionally extend beyond the boundaries of the light-emitting elements.

Depending on the embodiment, pattern templates may be bigger than the target substrates to facilitate placement tolerance. For example, pattern templates 910, 920, 930 cover a wider surface area than the target substrates or portions 915, 925, 935. Thus, for example, if the checkerboard pattern template 910 is shifted upward, a top portion of the light-converting material is no longer associated with the light-emitting element underneath. However, a bottom portion of light-converting material, of about the same amount, is introduced, and the overall amount of patterned light-converting material is substantially unchanged. The pattern template 910 is thus placement-tolerant under left, right, upward or downward lateral displacement within a plane parallel to the target substrate 915. As another example, if the pattern templates 920 or 930 are rotated, the amount of light-converting material overtop and/or proximate to an associated target substrate 925 or 935 changes only by a limited amount. It is noted that cylinder symmetric pattern templates, for example, a solid disc, or with concentric rings (neither illustrated) are completely tolerant to rotation. If the radial pattern template 920 is shifted, upward or downward, the amount of light converting material deposited may change corresponding to an up-down sensitive pattern. If the radial pattern template 920 is shifted to the left or right, the proportion of target substrate 925 covered by light-converting material will remain constant until the perimeter of the light converting material will pass post the corner of the light emitting element. Thus the pattern template 920 corresponds to a left-right placement-tolerant pattern. Moving to a radial pattern template with eight segments at least partially improves tolerance against pattern translation in up-down or left right movement and rotation. The radial pattern template 930 corresponds to a substantially more placement-sensitive pattern under displacements, as no axis is immediately identified such that substantial displacement along said axis leaves unchanged the proportion of target substrate 935 covered by pattern.

FIG. 10 illustrates example pattern templates 1010 and 1030 for providing patterns which are placement-sensitive under certain conditions. For example, the pattern template 1010 comprises a left region 1015 and a right region 1020, each of which has a size larger than that of a corresponding target substrate or region thereof 1025. A different amount of light-converting material is substantially uniformly patterned via the left region 1015 in comparison to the right region 1020. By shifting the pattern template 1010 leftwards or rightwards, an amount of light-converting material applied to the target substrate or region thereof 1025 is thus controllable. However, the pattern of template 1010 is placement-tolerant in the up-down direction, regardless of left-right displacement.

The pattern template 1030 comprises a first region 1035 and a second region 1040, wherein a different amount of light-converting material is substantially uniformly patterned via the first region 1035 in comparison to the second region 1040. Starting from the illustrated position of the pattern template 1030 over top of the target substrate or region thereof 1045, leftward or rightward displacement of the pattern template 1030 by an incremental amount x will result in a corresponding change in the amount of area of the target substrate or region thereof 1045 being patterned via the first region 1035 and the second region 1040. For example, the first region 1035 may correspond to no application of light-converting material and the second region 1040 may corresponds to full application of light-converting material. For up to a predetermined amount of left or right displacement, the amount of target substrate or region thereof 1045 which is patterned via the first or second region changes in direction proportion to the amount of left or right displacement. Moreover, the constant of proportionality may be tuned by up displacing the pattern within its plane in the direction orthogonal to said left-right displacement. As long as the pattern template 1030 is not displaced from the illustrated position in the left-right direction, it also corresponds to a substantially placement-tolerant pattern in the up-down direction.

The degree by which the pattern of template 1030 is placement-tolerant is related to the amount by which the central axes 1037 and 1042 of the template cross the center point of the target substrate 1045. As illustrated, the vertical axis 1037 passes through the center point, so that the pattern is placement-tolerant under vertical translation. Conversely if it was the horizontal axis 1042 passing through the center point then the pattern would be placement-tolerant under horizontal translation. If neither axis 1037 or 1042 passes through the center point, the pattern would be placement-sensitive under both vertical and horizontal translation. Axes of symmetry thus play a role in identifying placement sensitivity of certain patterns.

More generally, proportion placement sensitivity for a pattern of one type of light-converting material can be evaluated as follows. The pattern template can be associated with a two-dimensional surface S on which a scalar field is defined. The scalar field represents, for each location on S, the amount of light-converting material to be patterned at that location. The scalar field may take on binary values in an embodiment where the light-converting material is either applied to a uniform thickness or not applied. Next, define a closed curve C, representing the size and shape of the target substrate or relevant portion thereof, such as an LED. The closed curve C is initially located at an arbitrary point on the surface S, but can be translated and/or rotated under arbitrary transformations T. The location of the closed curve C on the surface S under transformation T is denoted C(T). Define the intersection of the surface S and the closed curve C(T) as a sub-surface $S_C(T)$. The proportion of light-converting material patterned on the target substrate is then represented by a surface integral of the scalar field over the entire sub-surface $S_C(T)$. Placement sensitivity can then be evaluated as the rate of change of $S_C(T)$ with respect to a given variation in T. If the rate of change is near zero, the pattern is placement tolerant for the given variation in T. It is expected that proportion placement sensitivity for patterns of plural types of light-converting materials may be similarly evaluated by taking a surface integral over an appropriate vector field.

Single and Multiple Layers

In some embodiments, a single, typically patterned, layer of light-converting material may be applied to the target substrate in accordance with the present technology. For example, a single layer of phosphor may be deposited in a predetermined pattern onto a blue or ultraviolet pump LED die, wafer, or other target substrate.

In some embodiments, plural, typically patterned, layers of light-converting may be applied to the target substrate in accordance with the present technology. Each layer may be applied in a predetermined sequence, in accordance with a transfer process as described herein. The first layer is applied directly to the target substrate. Subsequent layers are applied to the target substrate on top of previously applied layers.

In some embodiments, the target substrate may be evaluated between layer applications. For example, chromaticity due to the combined light-emitting elements and light-converting material may be evaluated after application of one or more layers. Based on said evaluation, patterning of subsequent layers may be adjusted to achieve a desired chromaticity, or no further layers may be applied if a satisfactory chromaticity has been reached.

In some embodiments, a fresh donor substrate, that is, a portion from which light-converting material has not yet been transferred, or fresh portion of a donor substrate is used for application of each pattern. In some embodiments, a partially used donor substrate may be re-used, for example for applying a second pattern to the same target substrate or for applying a pattern to another target substrate, provided that the pattern is formed using portions of the donor substrate that have not been previously depleted of light-converting material. For example, two complimentary checkerboard patterns may be derived from the same donor substrate. As another example, the donor substrate may be displaced similarly to a typewriter ribbon, so that fresh portions are appropriately located where pattern transfer is to occur.

In some embodiments, plural layers of substantially the same light-converting material may be applied to the target substrate. By overlapping the plural layers, the thickness of the light-converting material on selected portions of the target substrate may be controllably adjusted, for example creating vertical stacks of light-converting material in predetermined regions. By varying thickness of regions of light-converting material such as phosphor, the contribution to resultant chromaticity of these regions may be controlled, as would be readily understood by a worker skilled in the art. In some embodiments, this provides an even higher degree of control over chromaticity than single-layer patterning. For example, assuming a 1 mm square LED, a 10 μm pattern pixel size, and 5 layers of pattern 'overwriting'. 50,000 different amounts of light-converting material may be applied. Thus, the proportion of target substrate covered by light-converting material in this example can be controllably varied from 0% to 100% in 0.002% increments.

Figure 11A:
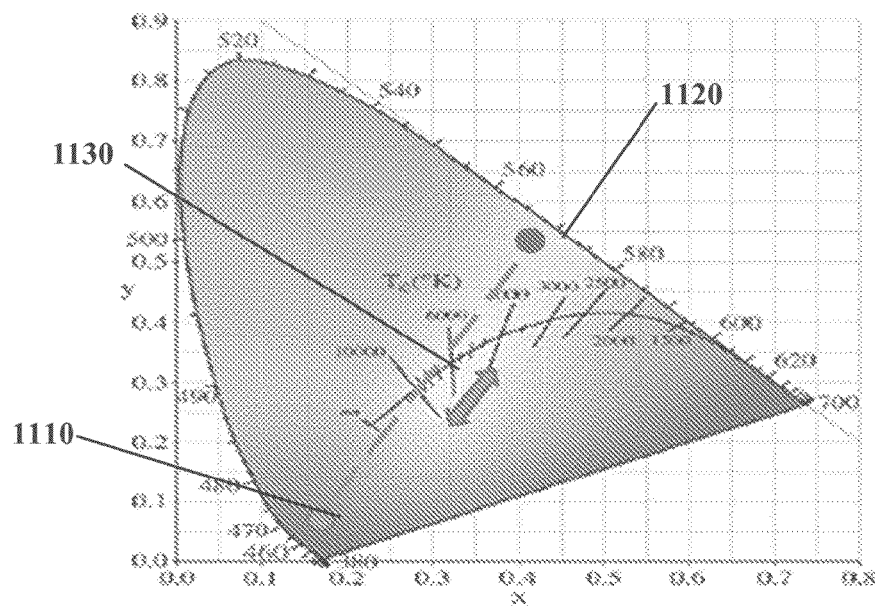
FIG. 11A illustrates chromaticities that can be achieved using a single light-converting material applied to a target substrate, in accordance with an embodiment of the present technology.

FIG. 11A illustrates a locus 1130 of chromaticities on a 1931 CIE chromaticity diagram, which can be achieved by patterning one layer or plural layers of the same light-converting material onto a target substrate. The target substrate associated with a light-emitting element having a predetermined chromaticity 1110. To a first approximation, the light-converting material absorbs light from the light-emitting element and emits light of a different chromaticity 1120. By varying the proportion of the target substrate covered by the light-converting material and the thickness of the light converting material, different chromaticity points along the linear locus 1130 may be achieved for the combined, light of the light-emitting element and the light-converting material. If the thickness of the color-converting material is thick enough such that all light emitted from the light-emitting element in communication with the color-converting dot is converted then 100% coverage results in chromaticity 1120. However, if the thickness of the color-converting layer is not sufficient to convert all light (light of the pump source leaks through) then the chromaticity space available through single layer coat is limited by the chromaticity point defined by 100% coverage. In this scenario multilayer coating will then further extend the available chromaticity space up to 1120.

In an exemplary embodiment, three layers of light-converting material are employed. The layer thickness may be designed such that combination of all three layers with 100% coverage achieves chromaticity 1120 (for example via complete absorption, and conversion of light from the pump light source), with each individual layer absorbing a fraction of the pump light. This approach may effectively increase the chromaticity resolution while maintaining the optical resolution.

In some embodiments, plural layers of different light-converting materials may be applied to the target substrate. This may be instead of or in addition to application of plural layers of the same light-converting material. Each different light-converting material may have different characteristics, such as a different emission chromaticity. For example, different light-converting materials may be phosphors with different tight absorption and/or re-emission spectral profiles. Use of plural layers of different light-converting material may facilitate achieving a desired chromaticity, a desired color rendering index (CRI) and/or to compensate for chromaticity variations of the light-emitting elements, light-converting materials, or a combination thereof. The layers of different chromaticity may be applied overlapping one another or not overlap one another or even separated by relatively small finite spaces.

Figure 11B:
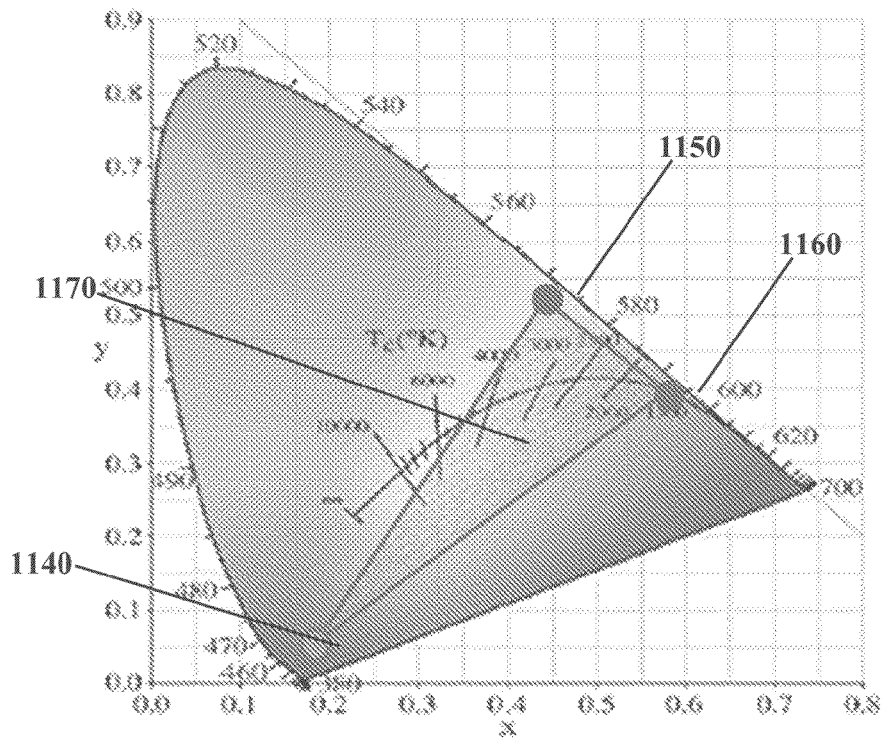
FIG. 11B illustrates chromaticities that can be achieved using two different light-converting materials applied to a target substrate, in accordance with an embodiment of the present technology.

FIG. 11B illustrates a substantially triangular region 1170 of chromaticities on a 1931 CIE chromaticity diagram, which can be achieved by patterning two different light-converting materials onto a target substrate in a non overlapping fashion. The target substrate associated with a light-emitting element having a predetermined chromaticity 1140. To a first approximation, a first light-converting material absorbs light from the light-emitting element and emits light of a different, spectrum 1150, and a second light-converting material absorbs light from the light-emitting element, and emits light of another different spectrum 1160. Assuming that no light of the pump wavelength bleeds through the corresponding color converter layers (100% conversion), by varying the proportions of the target substrate covered by the first and second light-converting material, any chromaticity points within the region 1170 may be achieved for the combined light of the light-emitting element and the light-converting materials. If the light-converting material does not achieve 100% conversion, a subset of points within the region 1170 may be achievable. If the plural light-converting materials interact cannibalistically, for example due to proximity and/or overlapping of the light-converting materials, some points within the region 1170 may not be achievable without adequately compensating for the cannibalistic effects.

In some embodiments, plural layers of different light-converting materials may be applied to the target substrate in an overlapping fashion. The target substrate is associated with one or more light-emitting elements having a predetermined chromaticity 1140. To a first approximation, a first light-converting material absorbs light from the light-emitting element and emits light of a different spectrum having chromaticity 1150, and a second light-converting material absorbs light from the light-emitting element, and emits light of another different spectrum having chromaticity 1160. The first light converting phosphor may be deposited first and the second light converting phosphor coated in a second step. This generates a chromaticity quadrangle having vertices of: the pump wavelength 1140 (in regions where no phosphor is applied), the response function of the first light converting phosphor 1150 (where only the first phosphor is applied), the response function of the second light converting phosphor 1160 (where only the second phosphor is applied in direct communication with the pump source), and the response function of the second phosphor on the first phosphor (where the second phosphor is coated onto the first phosphor).

In some embodiments comprising plural layers of different light-converting materials applied to the target substrate, different light-converting materials may be deposited in a non-overlapping manner. For example, the target substrate may be divided into contiguous or non-contiguous regions, each region covered by only one type of light-converting material. By avoiding overlapping of light-converting materials, undesired effects such as cannibalistic effects, due to combination of different light-converting materials, can be controlled or avoided.

As would be readily understood by a worker skilled in the art, the absorption and emission bands of certain light-converting materials such as phosphors can be relatively close and even overlapping. For instance, a YAG:Ce yellow phosphor may absorb at 420 to 500 nanometers wavelength and emit at 500 to 650 nanometers, predominantly in the yellow region of the spectrum (thus the yellow tint). Therefore, for example, if an orange/red emission is desired to boost the long wavelength tail, this phosphor may absorb at 450 to 600 nanometers. This overlaps substantially the emission of the yellow phosphor, removing some of that emission from the final spectrum. This phenomenon may be readily understood by a worker skilled in the art, for example in relation to radiation trapping and cannibalization. Such cannibalisation can be undesirable as it reduces the efficiency of the system. By patterning the deposits in small dots as described herein, regions of different phosphors, which would otherwise exhibit cannibalization are substantially removed from their neighbours, thereby reducing or inhibiting such cannibalisation. By providing a spaced-apart and non-overlapping arrangement, plural light-converting materials may be utilized, even if those materials would not otherwise be compatible if they were present in a single mixture due to cannibalization. This may allow for use of plural phosphors or other light-converting materials with much closer emission peaks than in other prior art solutions, allowing a more uniform final emission spectrum. Benefits can be found both in improved luminous efficacy of such a device (without reabsorption of converted light) and in improved Color Rendering Index CRI due to better approximation of spectral composition of a black body light source.

In some embodiments comprising plural layers of different light-converting materials applied to the target substrate, different light-converting materials may be deposited in an at least partially overlapping manner.

Figure 12A:
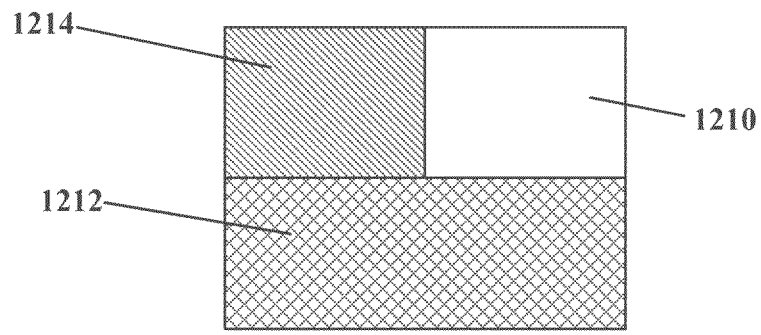
FIGS. 12A to 12C illustrate target substrates applied with non-overlapping or overlapping patterns of light-converting material, in accordance with embodiments of the present technology.
Figure 12B:
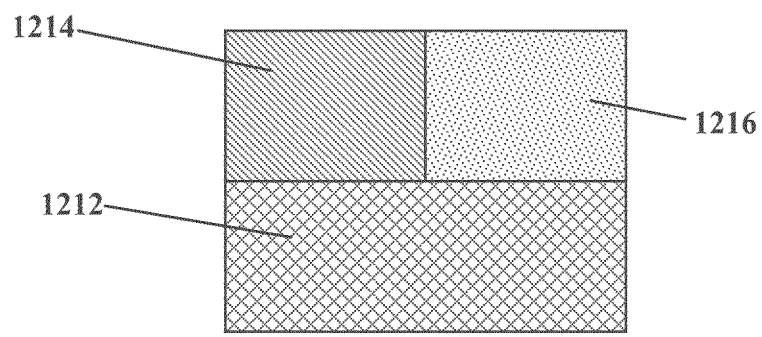
Figure 12C:
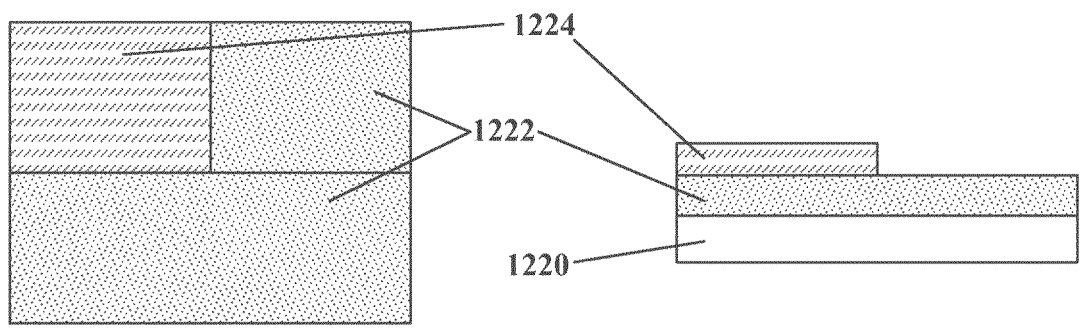

FIGS. 12A to 12C illustrate examples of target substrates applied with non-overlapping or overlapping patterns of light-converting material. FIG. 12A illustrates a top view of a target substrate 1210 such as a blue LED. A first region 1212 of the target substrate 1210 has been contiguously patterned with yellow phosphor, and a second region 1214 of the target substrate 1210 has been contiguously patterned with another material such as red phosphor or red quantum dot material. FIG. 12B illustrates a top view of the target substrate 1210, wherein another portion 1216 of the target substrate 1210 is patterned with another light-converting material. In FIGS. 12A and 12B, none of the different regions 1212, 1214, 1216 overlap. In contrast, FIG. 12C illustrates top and side views of a target substrate 1220 applied with a first layer 1222 of light-converting material over its entirety, and a second layer 1224 of light-converting material over a portion of the first layer 1222. Optionally, the first layer 1222 may cover only a portion of the target substrate 1220, and/or the second layer 1224 may cover the entire first layer 1222 and optionally also all of the target substrate 1220. Different portions of the target substrate, for example corresponding to different LEDs, may be patterned differently, for example in order to individually tune, chromaticity of each portion of the substrate.

Figure 16:
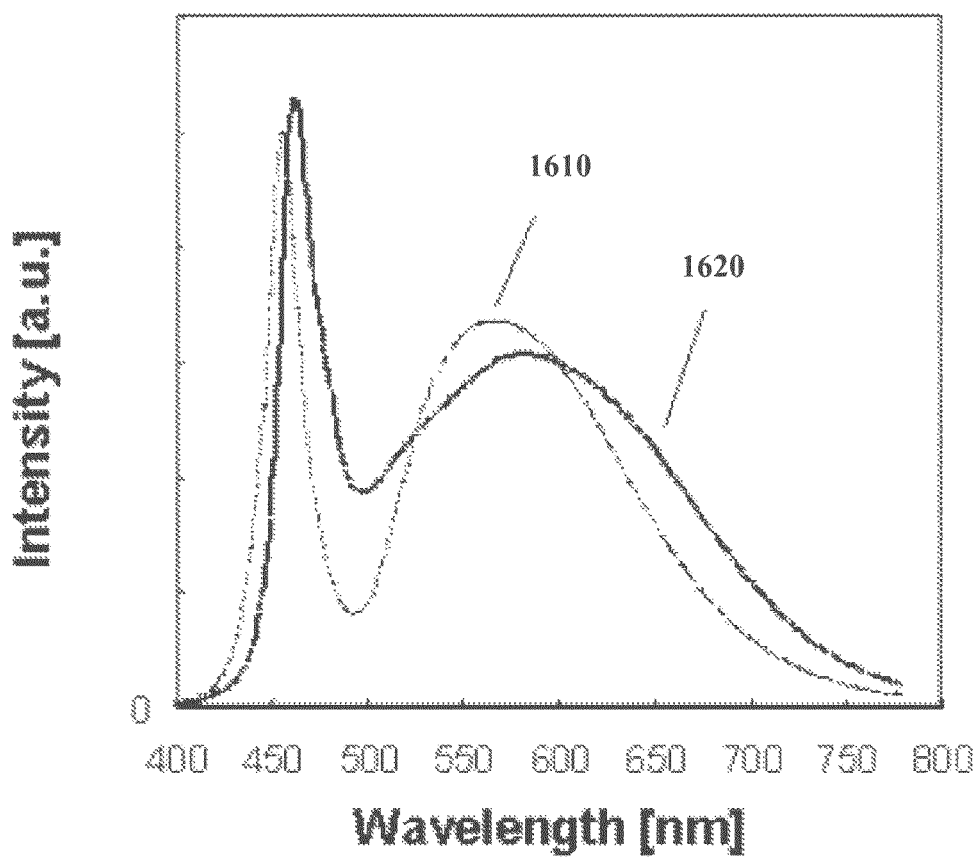
FIG. 16 illustrates emission spectra of light emitted from combinations of light-emitting elements and light-converting materials.

Depending on the embodiment two or more layers of different light-converting materials with corresponding emission spectra may be combined to provide a predetermined emission spectrum and/or color-rendering index (CRI) of the combined, light. Depending on the embodiment, light-converting material, may be disposed, to aid in mitigation of cannibalization of light, therein and/or in the provision of combined light with a smooth emission spectrum that exhibits a variation with wavelength that may be at, above or below a predetermined level. For example. FIG. 16 illustrates emission spectra 1610 of different combinations of light-emitting elements and light-converting materials. As can be seen, the emission spectrum 1620 does not have as pronounced a valley in the 500 nm region as the spectrum 1610.

In some embodiments, and as described above, two different light-converting materials are applied to the target substrate. This facilitates chromaticity variation of the combined light due to the light-emitting elements and light-converting materials in a predetermined two-dimensional region of the CIE color diagram. In some embodiments, three or more different light-converting materials may be applied to the target substrate. This facilitates chromaticity variation of the combined light in another two-dimensional region of the CIE color diagram. In some embodiments, this region may generally be described as being contained within the convex polygon defined by the chromaticity points describing the light-emitting elements and the light-converting materials.

In some embodiments wherein three or more different light-converting materials are applied to the target substrate, some chromaticities may be obtainable via two or more different chromaticity solutions, wherein each chromaticity solution represents application of one or more light-converting materials over a specified proportion of the target substrate. In other words, an under-constrained problem is created, whereby more degrees of freedom (proportions of the target substrate covered by each light-converting material) are available than are required for obtaining one or more chromaticities. In this case, a chromaticity solution may be selected, from the plural available solutions, based on one or more other criteria. For example, a solution may be selected which also results in combined light output having close to a desired luminous flux output or color rendering index. Selection may be performed by a mathematical optimization algorithm, lookup table, or the like.

Post-Transfer Processes

In some embodiments, a baking and/or annealing process is performed after transfer of the light-converting materials. Such a process may be used to more permanently affix the light-converting materials to the target layer, to cure binder materials and adhesives, reflow layers, seal surfaces, level surfaces and the like.

Apparatus

Aspects of the present technology relate to an apparatus for coupling one or more light-emitting elements with a light-converting material. The apparatus generally comprises an operating area configured to receive a target substrate and a donor substrate, a laser configured to energize one or more selected locations of the donor substrate located in the operating area, and a motion system configured to controllably align the laser with the one or more selected locations for energization.

Embodiments of the present technology may utilize a thermal laser imaging head such as provided in the Kodak Squarespot™ product line, or the alternately Agfa Excalibur™ product line. For example, a laser imaging head with 2400 dpi resolution may provide sufficient optical resolution and addressability with a pixel size of approximately 10 µm and may also provide sufficient optical output power to achieve transfer at high throughput levels. An example laser may have 20 W nominal power and/or provide infrared light at 830 nm or longer. Example thermal imaging systems may be adapted to image substrates wrapped around drums, or substrates laid on a flat surface.

Embodiments of the present technology utilize a laser with emissions peaks in the near infrared spectrum, for example near 830 nm. Embodiments of the present technology may utilize lasers with emission peaks at other wavelengths, for example at 1064 nm as provided by NdYAG lasers, 980 nm provided by InP lasers, about 1310 nm or 1530 to 1560 nm or other wavelengths as provided by Erbium doped fiber lasers, or quantum cascade or other lasers. Embodiments of the present technology associated with such lasers typically utilize a thermally activated process for transfer of light-converting material. Equipment incorporating such lasers and capable of operating same with high resolution and high optical output is readily available in the industry.

In some embodiments transfer of light-converting material may be initiated by a blue near UV or UV laser, or other laser, for example. In this case, the transfer process may shift from a thermally activated process to a photon-activated process, as described herein. In one embodiment a near UV imaging system such as the AGFA Galileo™ CTP may be utilized. The Agfa Galileo imaging system provides 2400 dpi at 410 nm wavelength. In some embodiments a laser may be configured to utilize higher harmonics of the NdYAG wavelength of 1064 nm such as frequency doubled 532 nm, tripled 355 nm or quadrupled 256 nm wavelengths. Some embodiments may also utilize deep UV emission as supplied by excimer lasers, for example.

In some embodiments, the apparatus comprises a motion control system, such as a robotic actuation system, configured to move the laser and/or donor and target substrates with adequate accuracy for patterning. Various motion control systems, enabled by computer automation equipment, may be utilized as would be readily understood by a worker skilled in the art. Various commercially available systems such as the Kodak Squarespot™ product line incorporate motion control systems.

In some embodiments, the apparatus comprises a registration system, such as a machine vision system or mechanical registration system, which is configured to ensure registration of the target substrate and/or donor substrate prior to patterning via laser. The registration system may further be configured to register a position of the target substrate relative to a baseline coordinate system, so that physical offsets between the target substrate and the baseline coordinate system may be compensated for, thereby reducing potential for pattern misalignment and hence improving accuracy of chromaticity or other aspect of the resulting product.

The technology will now be described with reference to specific example. It will be understood that the example is intended to describe embodiments of the technology and are not intended to limit the technology in any way.

Example

Figure 13A:
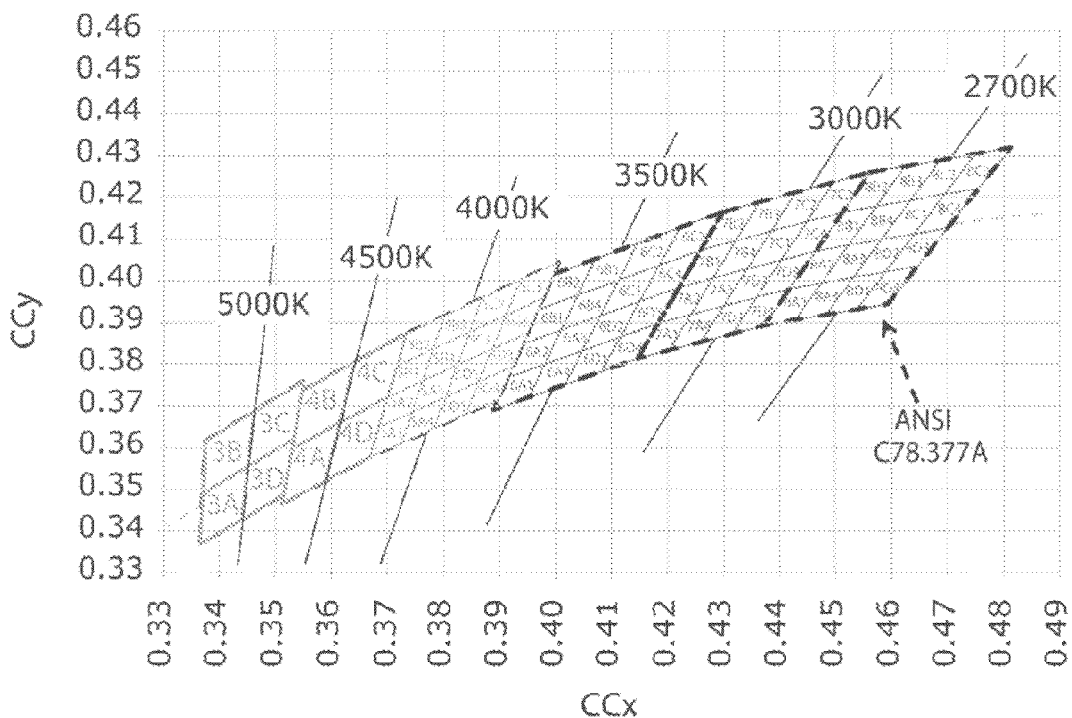
FIG. 13A illustrates a typical prior art chromaticity-binning diagram used by a commercial LED manufacturer.
Figure 13B:
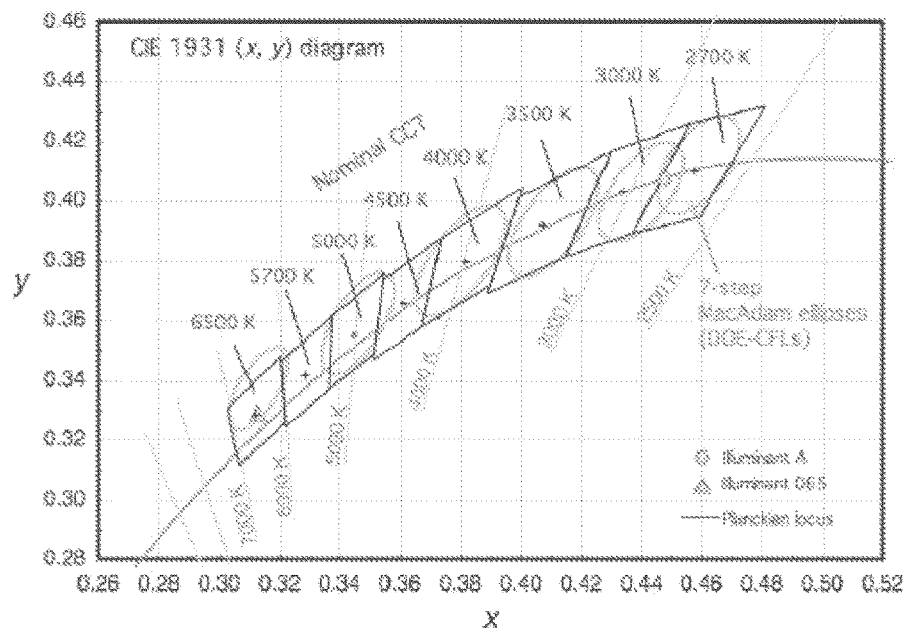
FIG. 13B displays a prior art chromaticity tolerance specification for general illumination solid-state light sources.
Figure 13C:
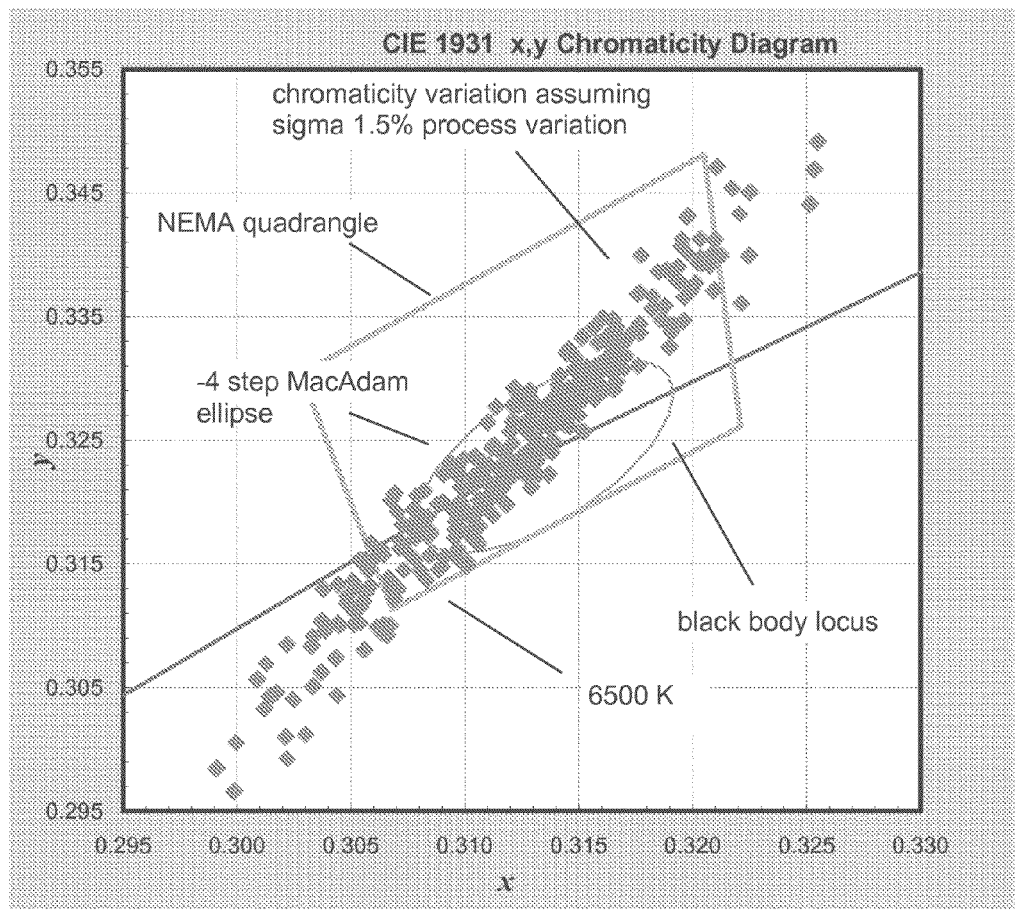
FIG. 13C displays a hypothetical chromaticity distribution of a batch of blue pump LEDs with white phosphor coating, produced in accordance with a prior art manufacturing process.

The present example illustrates tunability of white light LEDs manufactured in accordance with an embodiment of the present technology, in comparison to the prior art. FIG. 13A illustrates an example binning diagram used by a commercial LED manufacturer. Each region of the binning diagram corresponds to a region of the CIE 1931 (x,y) chromaticity diagram. In a typical manufacturing step, LEDs are tested to determine their chromaticity associated with a corresponding bin. FIG. 13B displays the ANSI C378.77 tolerance specification for general illumination solid-state light sources, on a CIE 1931 (x,y) chromaticity diagram. Each quadrangle on the diagram represents a range of chromaticities that adequately correspond to a nominal correlated colour temperature (CCT) at the center of the quadrangle. A 7-step Macadam Ellipse is also illustrated for each nominal CCT. FIG. 13C displays a hypothetical chromaticity distribution of a batch of blue pump LEDs with white phosphor coating, produced in accordance with a prior art manufacturing process, assuming sigma 1.5% process variation and about 2 nm wavelength variation in wavelength of light from the blue LEDs. Such prior art manufacturing methods can provide predetermined consistency among binned devices on the order of a 7 step MacAdam ellipse or approximately Duv 0.012. Here the Duv refers to the 1976 CIE Chromaticity Diagram (not illustrated), where the sum of the differences of each coordinate of the corners of the region of interest is 0.012. That is, $[(u'1-u'2)^2+(v'1-v'2)^2]^{1/2}=0.012$, where u'1 v'1 and u'2 v'2 are chromaticity coordinates.

Figure 13D:
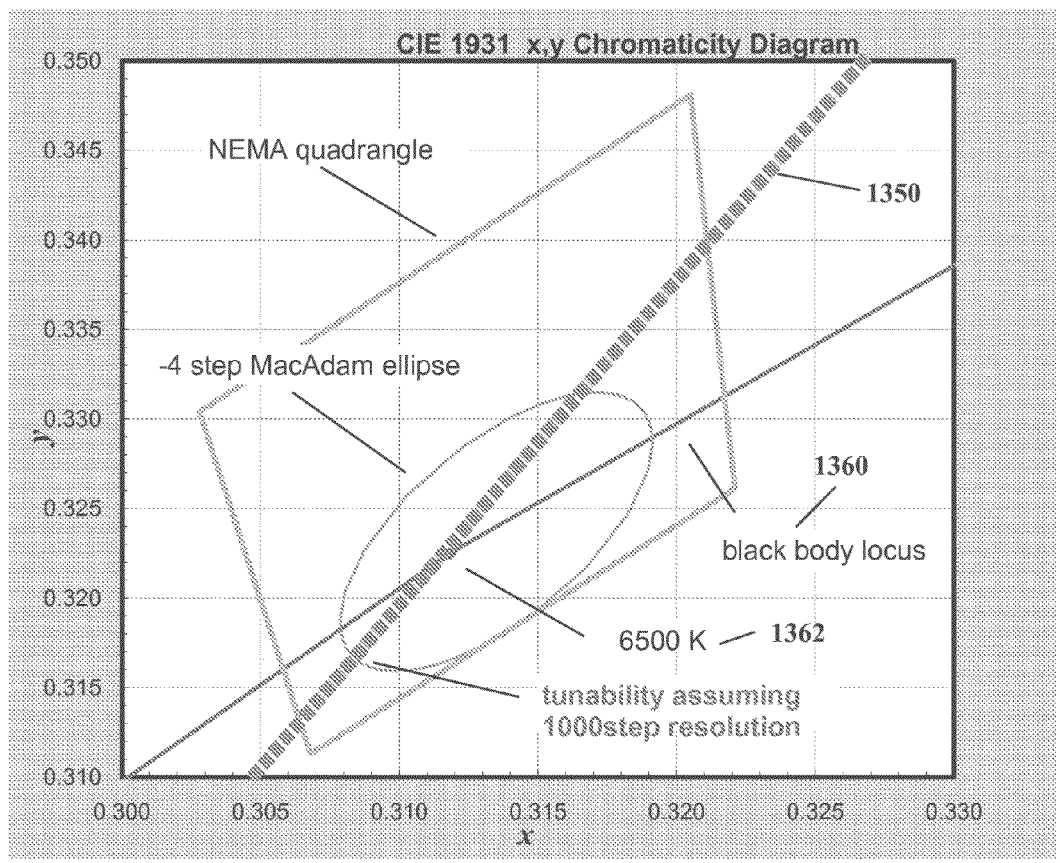
FIG. 13D illustrates a locus of achievable and tunable chromaticity's of white light emitting phosphor coated blue LEDs manufactured in accordance with an exemplary embodiment of the present, technology.
Figure 14:
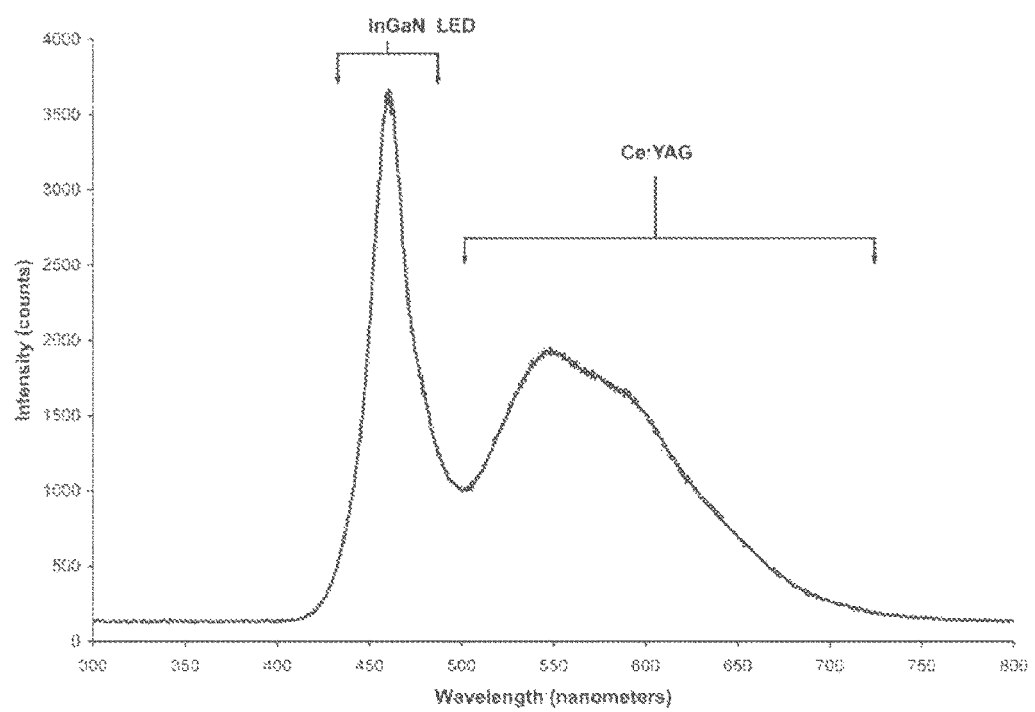
FIG. 14 illustrates a spectrum of light due to emission of a light-emitting element being partially converted by plural phosphors, in accordance with an exemplary embodiment of the present technology.

FIG. 13D illustrates the chromaticity tunability, on a CIE 1931 (x,y) chromaticity diagram, of white phosphor coated blue. LEDs manufactured in accordance with an exemplary embodiment of the present technology, assuming a fixed chromaticity for the LEDs and phosphor source. Assuming the amount of phosphor coating can be adjusted from 0% to 100% in increments of 0.1%, a tunability resolution of Duv 0.0003 can be achieved. Adjacent squares on the locus 1350 differ by 0.1% in the amount of phosphor coating applied. The locus 1350 passes through the 6500 K chromaticity point 1362 on the black body curve 1360. When chromaticity of the LEDs and/or phosphor source vary, evaluation and feedback mechanisms may be used to adjust the amount of phosphor coating, thereby achieving tight manufacturing tolerances.

It is obvious that the foregoing embodiments of the technology are examples and can be varied in many ways. Such present or future variations are not to be regarded as a departure from the spirit and scope of the technology, and all such modifications as would be obvious to one skilled in the art are intended to be included within the scope of the following claims.

What is claimed is:

1. A method for coupling one or more light-emitting elements with a light-converting material, comprising:
   a) providing a target substrate, the target substrate associated with the one or more light-emitting elements;
   b) providing a donor substrate proximate to the target substrate, the donor substrate comprising the light-converting material and configured to transfer a portion of the light-converting material to the target substrate upon a predetermined energization of a corresponding portion of the donor substrate;

c) measuring one or more first optical properties of the one or more light-emitting elements;

d) determining one or more desired optical, properties of a combination of the one or more light-emitting elements and the light-converting material;

e) determining a pattern of the light-converting material to be transferred to the target substrate based on the one or more desired optical properties and the one or more first optical properties; and f) controllably energizing one or more locations of the donor substrate selected in accordance with the pattern, thereby transferring the light-converting material from the donor substrate to the target substrate at said one or more selected locations.

2. A method for coupling one or more light-emitting elements with a light-converting material, comprising:

a) providing a target substrate, the target substrate associated with the one or more light-emitting elements;

b) providing a donor substrate proximate to the target substrate, the donor substrate comprising the light-converting material and configured to transfer a portion of the light-converting material to the target substrate upon a predetermined energization of a corresponding portion of the donor substrate;

c) measuring one or more first optical properties of the one or more light-emitting elements;

d) measuring one or more second optical properties of the donor substrate;

e) determining one or more desired optical properties of a combination of the one or more light-emitting elements and the light-converting material;

f) determining a pattern of the light-converting material to be transferred to the target substrate based on the one or more desired optical properties, the one or more first optical properties and the one or more second optical properties; and g) controllably energizing one or more locations of the donor substrate selected in accordance with the pattern, thereby transferring the light-converting material from the donor substrate to the target substrate at said one or more selected locations.

3. The method according to claim 1, wherein the target substrate comprises the one or more light-emitting elements, or wherein the target substrate comprises an optically transmissive material for positioning proximate to the one or more light-emitting elements.

4. A method for coupling one or more light-emitting elements with a light-converting material, comprising:

a) providing a target substrate, the target substrate associated with the one or more light-emitting elements;

b) providing a donor substrate proximate to the target substrate, the donor substrate comprising the light-converting material and configured to transfer a portion of the light-converting material to the target substrate upon a predetermined energization of a corresponding portion of the donor substrate;

c) controllably energizing one or more selected locations of the donor substrate, thereby transferring the light-converting material from the donor substrate to the target substrate at said one or more selected locations;

wherein, after transferring the light-converting material from the donor substrate to the target substrate, the method further comprises:

d) providing a second donor substrate proximate to the target substrate, the second donor substrate comprising a second light-converting material and configured to transfer a second portion of the second light-converting material to the target substrate upon a second predetermined energization of a second corresponding portion of the donor substrate; and e) controllably energizing one or more second selected locations of the donor substrate, thereby transferring the second light-converting material from the second donor substrate to the target substrate at said one or more second selected locations.

5. The method according to claim 4, wherein the one or more selected locations form a pattern covering a predetermined proportion of the target substrate, said predetermined proportion selected based on one or more desired optical properties of a combination of the one or more light-emitting elements and the light-converting material.

6. The method according to claim 5, wherein the pattern is configured such that the predetermined proportion is substantially unchanged under up to a predetermined amount of alignment variation between the pattern and the one or more light-emitting elements.

7. The method according to claim 5, wherein the pattern is configured such that the predetermined proportion varies in a predetermined manner with alignment variation between the pattern and the one or more light-emitting elements, and where said alignment variation is selected to control said predetermined proportion.

8. The method according to claim 5, wherein the pattern is a regular pattern, a pseudo-randomized pattern, or a randomized pattern, and a feature of the pattern has a nominal shape selected from a group consisting of polygons, rectangles, squares, parallelograms, trapezoids, ellipses, circles, and ovals.

9. The method according to claim 5, wherein the pattern is configured to cover a first predetermined proportion of a first portion of the target substrate and the pattern is configured to cover a second predetermined proportion of a second portion of the target substrate, the first predetermined proportion different from the second predetermined proportion.

10. The method according to claim 4, wherein at least one of the one or more second selected locations at least, partially overlaps, at least one of the one or more selected locations.

11. The method according to claim 4, wherein at least one of the second selected locations and the one or more selected locations are free from overlaps.

12. The method according to claim 4, wherein the second light-converting material and the light-converting material are one of nominally equal and different.

13. The method according to claim 2, wherein energizing of the one or more selected locations is performed by a laser.

14. A lighting device manufactured according to claim 4.

* * * * *